United States Patent
Ie et al.

(10) Patent No.: US 11,339,473 B2
(45) Date of Patent: May 24, 2022

(54) APPARATUS FOR ATOMIC LAYER DEPOSITION AND METHOD OF FORMING THIN FILM USING THE APPARATUS

(71) Applicant: SAMSUNG ELECTRONICS CO., LTD., Suwon-si (KR)

(72) Inventors: Sang-Yub Ie, Hwaseong-si (KR); Guk-Hyon Yon, Hwaseong-si (KR); Jung-Geun Jee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 350 days.

(21) Appl. No.: 16/522,372

(22) Filed: Jul. 25, 2019

(65) Prior Publication Data

US 2020/0216953 A1  Jul. 9, 2020

(30) Foreign Application Priority Data

Jan. 9, 2019 (KR) .......... 10-2019-0002987

(51) Int. Cl.
*C23C 16/48* (2006.01)
*C23C 16/455* (2006.01)
(Continued)

(52) U.S. Cl.
CPC ........ *C23C 16/45531* (2013.01); *C23C 16/24* (2013.01); *C23C 16/45553* (2013.01);
(Continued)

(58) Field of Classification Search
CPC . C23C 16/45531; C23C 16/481; C23C 16/24; C23C 16/52; C23C 16/45553;
(Continued)

(56) References Cited

U.S. PATENT DOCUMENTS 5,174,881 A * 12/1992 Iwasaki ................ C23C 14/022
  118/715
5,240,556 A *  8/1993 Ishikawa ............... C23C 16/54
  216/67

(Continued)

FOREIGN PATENT DOCUMENTS

JP   2005167093     6/2005
KR   10-0805526     2/2008
KR   10-2011-0133690  12/2011

*Primary Examiner* — Rudy Zervigon
(74) *Attorney, Agent, or Firm* — F. Chau & Associates, LLC

(57) ABSTRACT

An ALD apparatus includes a first process chamber configured to supply a first source gas and induce adsorption of a first material film. A second process chamber is configured to supply a second source gas and induce adsorption of a second material film. A third process chamber is configured to supply a third source gas and induce absorption of a third material film. A surface treatment chamber is configured to perform a surface treatment process on each of the first to third material films and remove a reaction by-product. A heat treatment chamber is configured to perform a heat treatment process on the substrate on which the first to third material films are adsorbed in a predetermined order and transform the first to third material films into a single compound thin film.

18 Claims, 20 Drawing Sheets

(51) Int. Cl.
*H01L 21/02* (2006.01)
*C23C 16/24* (2006.01)
*C23C 16/52* (2006.01)

(52) U.S. Cl.
CPC ............ *C23C 16/481* (2013.01); *C23C 16/52* (2013.01); *H01L 21/0228* (2013.01); *H01L 21/02123* (2013.01)

(58) Field of Classification Search
CPC ....... C23C 16/308; C23C 16/48; C23C 16/54; C23C 16/56; C23C 16/45551; C23C 16/0227; C23C 16/45544; C23C 16/4581; C23C 16/45536; H01L 21/0228; H01L 21/02123; H01L 21/68771; H01L 21/68764; H01L 21/67748; H01L 21/67706; H01L 21/67109; H01L 21/0214; H01L 21/02219; H01L 21/67098; H01L 21/67028
USPC .................. 118/719; 156/345.31, 345.32
See application file for complete search history.

(56) References Cited

U.S. PATENT DOCUMENTS

| | | | | |
|---|---|---|---|---|
| 5,407,867 | A * | 4/1995 | Iwasaki | C23C 14/022 438/694 |
| 5,501,739 | A * | 3/1996 | Yamada | B05D 1/60 118/719 |
| 5,556,472 | A * | 9/1996 | Nakamura | C23C 14/24 118/719 |
| 5,571,749 | A * | 11/1996 | Matsuda | H01L 31/076 438/484 |
| 5,683,561 | A * | 11/1997 | Hollars | H01L 21/67259 204/298.25 |
| 5,766,360 | A * | 6/1998 | Sato | C23C 16/4412 118/666 |
| 5,863,170 | A | 1/1999 | Boitnott et al. | |
| 5,863,338 | A * | 1/1999 | Yamada | B05D 1/60 118/719 |
| 5,909,632 | A * | 6/1999 | Gessert | H01L 29/45 438/603 |
| 6,461,444 | B1 * | 10/2002 | Nishio | C23C 16/54 134/29 |
| 6,467,491 | B1 * | 10/2002 | Sugiura | H01L 21/681 134/1.3 |
| 6,599,368 | B1 * | 7/2003 | Morad | C23C 16/0227 118/719 |
| 6,776,847 | B2 * | 8/2004 | Yamazaki | C23C 14/042 118/724 |
| 7,282,444 | B2 | 10/2007 | Tanida et al. | |
| 7,316,983 | B2 * | 1/2008 | Yamazaki | H01L 51/56 438/780 |
| 7,824,497 | B2 * | 11/2010 | Watanabe | G11B 5/84 118/719 |
| 8,207,010 | B2 * | 6/2012 | Yamazaki | H01L 31/075 438/96 |
| 8,465,591 | B2 * | 6/2013 | Kato | C23C 16/45551 118/719 |
| 8,853,100 | B2 | 10/2014 | Igeta et al. | |
| 8,882,915 | B2 * | 11/2014 | Kato | C23C 16/458 118/719 |
| 8,895,942 | B2 * | 11/2014 | Liu | C23C 16/56 250/492.1 |
| 8,992,685 | B2 | 3/2015 | Kato et al. | |
| 9,391,024 | B2 | 7/2016 | Xie et al. | |
| 2001/0021412 | A1 * | 9/2001 | Watanabe | G11B 5/8408 427/130 |
| 2002/0028286 | A1 * | 3/2002 | Sasaki | C23C 16/54 427/131 |
| 2003/0200927 | A1 * | 10/2003 | Watanabe | C23C 14/568 118/719 |
| 2004/0139914 | A1 * | 7/2004 | Yamazaki | C23C 14/24 118/719 |
| 2004/0187784 | A1 * | 9/2004 | Sferlazzo | C23C 16/45508 118/719 |
| 2004/0237896 | A1 * | 12/2004 | Hongo | C25D 17/001 118/719 |
| 2005/0005848 | A1 * | 1/2005 | Yamazaki | C23C 14/12 118/719 |
| 2005/0005850 | A1 * | 1/2005 | Yamazaki | H01L 21/67167 118/719 |
| 2007/0020890 | A1 * | 1/2007 | Thakur | H01L 21/67184 438/478 |
| 2009/0029502 | A1 * | 1/2009 | Choi | H01L 21/67201 438/57 |
| 2009/0324828 | A1 * | 12/2009 | Kato | C23C 16/402 427/255.28 |
| 2010/0050943 | A1 * | 3/2010 | Kato | C23C 16/401 118/730 |
| 2010/0055297 | A1 * | 3/2010 | Kato | C23C 16/4584 427/8 |
| 2010/0055312 | A1 * | 3/2010 | Kato | C23C 16/45502 427/255.26 |
| 2010/0055316 | A1 * | 3/2010 | Honma | C23C 16/45551 427/255.28 |
| 2010/0055347 | A1 * | 3/2010 | Kato | C23C 16/45551 427/569 |
| 2010/0065759 | A1 * | 3/2010 | Liu | B23K 26/082 250/492.1 |
| 2010/0132615 | A1 * | 6/2010 | Kato | C23C 16/45578 118/725 |
| 2010/0243437 | A1 * | 9/2010 | Gessert | H01L 21/67748 204/298.09 |
| 2010/0260935 | A1 * | 10/2010 | Kato | H01L 21/68764 427/255.28 |
| 2011/0104395 | A1 * | 5/2011 | Kumagai | C23C 16/4401 427/554 |
| 2011/0151122 | A1 * | 6/2011 | Kato | C23C 16/45551 427/255.23 |
| 2011/0155057 | A1 * | 6/2011 | Kato | C23C 16/4584 118/719 |
| 2012/0193071 | A1 * | 8/2012 | Tsunekawa | H01L 21/6719 165/61 |
| 2013/0302937 | A1 * | 11/2013 | Jinbo | H01L 21/67 438/99 |
| 2014/0004713 | A1 * | 1/2014 | Igeta | C23C 16/303 438/775 |
| 2014/0011369 | A1 * | 1/2014 | Kato | H01L 21/02233 438/771 |
| 2014/0024200 | A1 * | 1/2014 | Kato | C23C 16/45551 438/473 |
| 2014/0220260 | A1 * | 8/2014 | Yamawaku | H01J 37/32733 427/569 |
| 2015/0361553 | A1 * | 12/2015 | Murakawa | C23C 16/52 156/345.55 |
| 2016/0097122 | A1 * | 4/2016 | Yudovsky | C23C 16/45551 118/725 |
| 2016/0208381 | A1 * | 7/2016 | Choi | H01L 21/67126 |
| 2016/0254136 | A1 * | 9/2016 | Sato | H01L 21/02123 438/782 |
| 2018/0237909 | A1 | 8/2018 | Yun et al. | |
| 2018/0240648 | A1 | 8/2018 | Wu et al. | |
| 2020/0216953 | A1 * | 7/2020 | Ie | H01L 21/02123 |
| 2020/0332415 | A1 * | 10/2020 | Bhuyan | H01L 21/02337 |

* cited by examiner

APPARATUS FOR ATOMIC LAYER DEPOSITION AND METHOD OF FORMING THIN FILM USING THE APPARATUS

CROSS-REFERENCE TO RELATED APPLICATION

This application claims the benefit of, and priority to, Korean Patent Application No. 10-2019-0002987, filed on Jan. 9, 2019, in the Korean Intellectual Property Office, the disclosure of which is herein incorporated by reference in its entirety.

TECHNICAL FIELD

The present disclosure relates to atomic layer deposition (ALD) and, more particularly, to an apparatus for ALD and a method of forming a thin film using the ALD apparatus.

DISCUSSION OF THE RELATED ART

An ALD process may be a process of forming a thin film using a chemisorption process and a desorption process. During the ALD process, a semiconductor substrate is exposed to two different gaseous precursors in an alternating manner. This creates a saturated surface reaction of reactants on a surface of the semiconductor substrate, and the separated reaction precursors may flow on the semiconductor substrate. An atomic thin film may thereby be formed by allowing the semiconductor substrate to be exposed to the reaction precursors for a predetermined time. Some of the reactants may be used as a component for growing the thin film, while other reactants may be used as a component for eliminating a ligand to facilitate a subsequent reaction.

SUMMARY

An atomic layer deposition apparatus includes a first process chamber configured to supply a first source gas to a substrate and to thereby induce adsorption of a first material film on the substrate. A second process chamber is configured to supply a second source gas to the substrate and to thereby induce adsorption of a second material film on the substrate. The second source gas is different from the first source gas. A third process chamber is configured to supply a third source gas to the substrate and to thereby induce absorption of a third material film on the substrate. The third source gas is different from each of the first and second source gases. A surface treatment chamber is configured to perform a surface treatment process on each of the first to third material films and to remove a reaction byproduct. A heat treatment chamber is configured to perform a heat treatment process on the substrate and to thereby transform the first to third material films into a single compound thin film.

An atomic layer deposition apparatus includes a process chamber configured to supply first to third source gases to a substrate in a predetermined order and to thereby induce absorption of first to third material films on the substrate in a predetermined order. A surface treatment chamber is configured to perform a surface treatment process on each of the first to third material films and to remove a reaction byproduct. A heat treatment chamber is configured to perform a heat treatment process on the substrate and to thereby transform the first to third material films into a single compound thin film.

An atomic layer deposition apparatus includes a plurality of unit modules, each of which includes a process chamber and a surface treatment chamber. A heat treatment chamber is configured to receive a plurality of substrates from the plurality of unit modules. The process chamber of each of the plurality of unit modules is configured to supply first to third source gases to each of the plurality of substrates in a predetermined order and to thereby induce adsorption of first to third material films on each of the plurality of substrates in the predetermined order. The surface treatment chamber of each of the plurality of unit modules is configured to perform a surface treatment process on each of the first to third material films and to remove a reaction byproduct. The heat treatment chamber performs a heat treatment process on the plurality of substrates on which the first to third material films are adsorbed in the predetermined order and thereby transforms the first to third material films into a single compound thin film.

An atomic layer deposition apparatus includes a chamber having a deposition region, a surface treatment region, and a heat treatment region. A rotation unit is disposed in the chamber. The rotation unit is configured to rotate a mounting region on which a substrate is mounted. A first supply line is disposed in the deposition region. The first supply line is configured to supply a first source gas to induce adsorption of a first material film on the substrate. A second supply line is disposed in the deposition region. The second supply line is configured to supply a second source gas to induce adsorption of a second material film on the substrate. The surface treatment region is disposed between the first supply line and the second supply line in a rotational direction of the rotation unit, and the second material film is different from the first material film. A third supply line is disposed in the deposition region. The third supply line is configured to supply a third source gas to induce adsorption of a third material film on the substrate. The surface treatment region is disposed between the second supply line and the third supply line in the rotational direction of the rotation unit. The third material film is different from each of the first and second material films. A first optical source irradiation unit is disposed in the surface treatment region. The first optical source irradiation unit is configured to irradiate the substrate to perform a surface treatment process for removing a reaction byproduct on each of the first to third material films. A second optical source irradiation unit and a heat source supply unit are each disposed in the heat treatment region. The second optical source irradiation unit and the heat source supply unit are configured to irradiate the substrate and heat the substrate, respectively, and to perform a heat treatment process on the substrate on which the first to third material films are adsorbed in a predetermined order.

A method of forming a thin film includes supplying a first source gas to a substrate in a first process chamber and thereby inducing adsorption of a first material film on the substrate. A second source gas is supplied to the substrate in a second process chamber and thereby induces adsorption of a second material film on the first material film. The second source gas is different from the first source gas. The first source gas is supplied to the substrate in the first process chamber and thereby induces adsorption of a first material film on the second material film. A third source gas is supplied to the substrate in a third process chamber and thereby induces adsorption of a third material film on the first material film. The third source gas is different from each of the first and second source gases. A surface treatment process is performed on an uppermost portion of the first to third material films in a surface treatment chamber and a reaction byproduct is removed, after the inducing of the adsorption of each of the first to third material films is performed. A heat treatment process is performed on the substrate on which the first to third material films are adsorbed in a predetermined order, in a heat treatment chamber, and the first to third material films are thereby transformed into a single compound thin film.

BRIEF DESCRIPTION OF THE DRAWINGS

A more complete appreciation of the inventive concept and many of the attendant aspects thereof will be more clearly understood from the following detailed description taken in conjunction with the accompanying drawings, in which.

DETAILED DESCRIPTION OF THE EMBODIMENTS

In describing exemplary embodiment of the present inventive concept with reference to the accompanying drawings, specific terminology is employed for sake of clarity. However, the present disclosure is not intended to be limited to the specific terminology so selected, and it is to be understood that each specific element includes all technical equivalents which operate in a similar manner.

Figure 1:
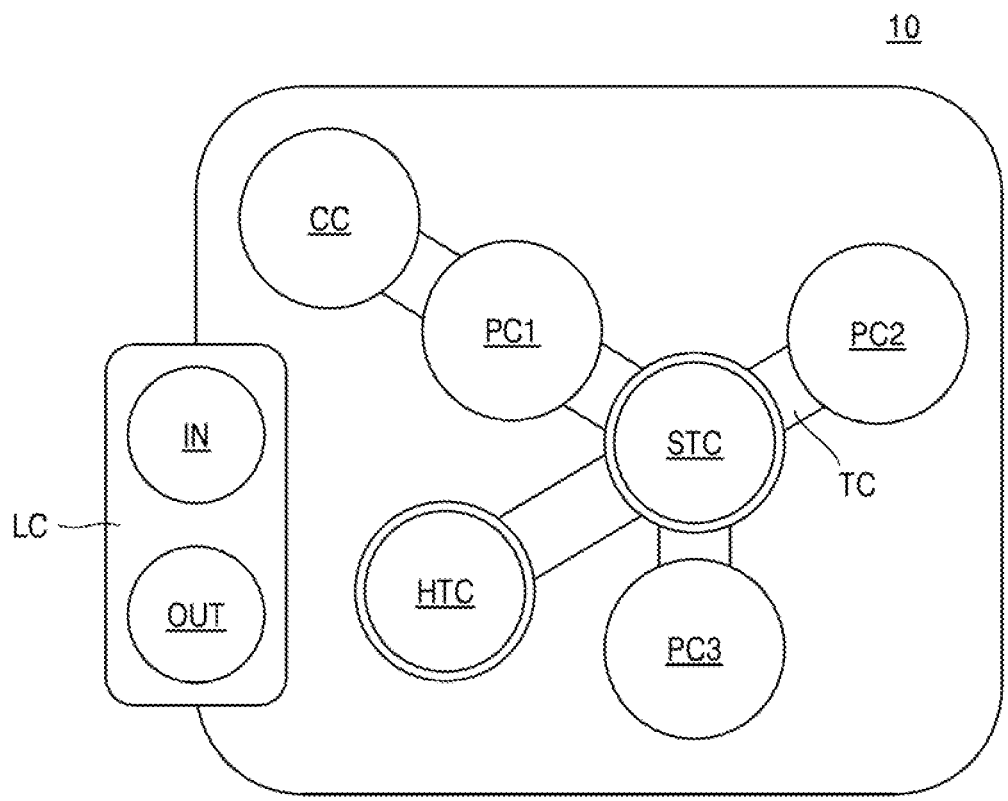
FIG. 1 is a schematic diagram illustrating an atomic layer deposition (ALD) apparatus according to an exemplary embodiment of the present disclosure.
Figure 2:
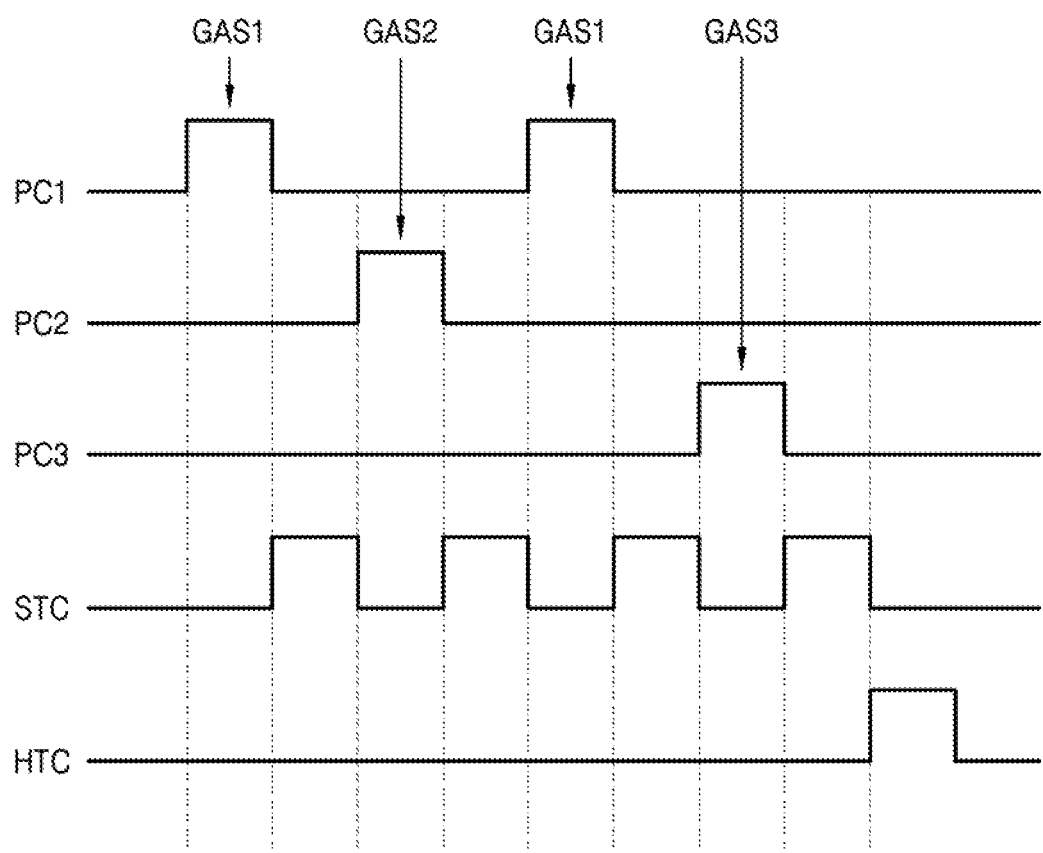
FIG. 2 is a waveform diagram showing a process of operating an ALD apparatus according to an exemplary embodiment of the present disclosure.

FIG. 1 is a schematic diagram illustrating an atomic layer deposition (ALD) apparatus 10 according to an exemplary embodiment of the present disclosure. FIG. 2 is a waveform diagram showing a process of operating the ALD apparatus 10 according to an exemplary embodiment of the present disclosure. FIGS. 3 to 6 are respectively cross-sectional views and a partial perspective view illustrating respective chambers included in the ALD apparatus 10 of FIG. 1.

Referring to FIGS. 1 to 6, the ALD apparatus 10 may include a load lock chamber LC including a loading chamber IN configured to load a substrate (e.g. wafer) WF and an unloading chamber OUT configured to unload the substrate WF, a cleaning chamber CC configured to clean a surface of the substrate WF, first to third process chambers PC1, PC2, and PC3 configured to induce the adsorption of material films on the substrate WF, a surface treatment chamber STC configured to perform a surface treatment process on the adsorbed material films, a heat treatment chamber HTC configured to perform a heat treatment process on the adsorbed material films in a predetermined order, and a transfer chamber TC configured to transfer the substrate WF between each of the various chambers.

The load lock chamber LC shown in FIG. 1 may include the loading chamber IN configured to load the substrate WF into the ALD apparatus 10 and the unloading chamber OUT configured to unload the substrate WF out of the ALD apparatus 10. The substrate WF may temporarily remain in the loading chamber IN prior to having an ALD process performed thereon. Also, the substrate WF may temporarily remain in the unloading chamber OUT after having the ALD process performed thereon.

Before the ALD process is performed on the substrate WF, the cleaning chamber CC shown in FIG. 1 may perform a preliminary operation for adsorbing any reactants that may be on the surface of the substrate WF. For example, the cleaning chamber CC shown in FIG. 1 may expose the surface of the substrate WF with ion beams and clean the surface of the substrate WF thereby. For example, an ion beam unit in the cleaning chamber CC may irradiate the surface of the substrate WF loaded into the cleaning chamber CC and remove foreign materials attached to the surface of the substrate WF thereby.

The first to third process chambers PC1 to PC3 shown in FIG. 1 may supply different source gases (e.g., first to third source gases GAS1 to GAS3) to the substrate WF and induce the adsorption of different material films, for example, first to third material films (refer to M1 to M3 in FIGS. 7A to 7E). The first process chamber PC1 may form the first material film (refer to M1 in FIG. 7A) using the first source gas GAS1, the second process chamber PC2 may form the second material film (refer to M2 in FIG. 7C) using the second source gas GAS2, and the third process chamber PC3 may form the third material film (refer to M3 in FIG. 7E) using the third source gas GAS3. The number of first to third process chambers PC1 to PC3 may be only exemplary and the present invention is not limited thereto.

Since the first to third process chambers PC1 to PC3 have substantially the same structure, the first process chamber PC1 will be described as an example for brevity.

Figure 3:
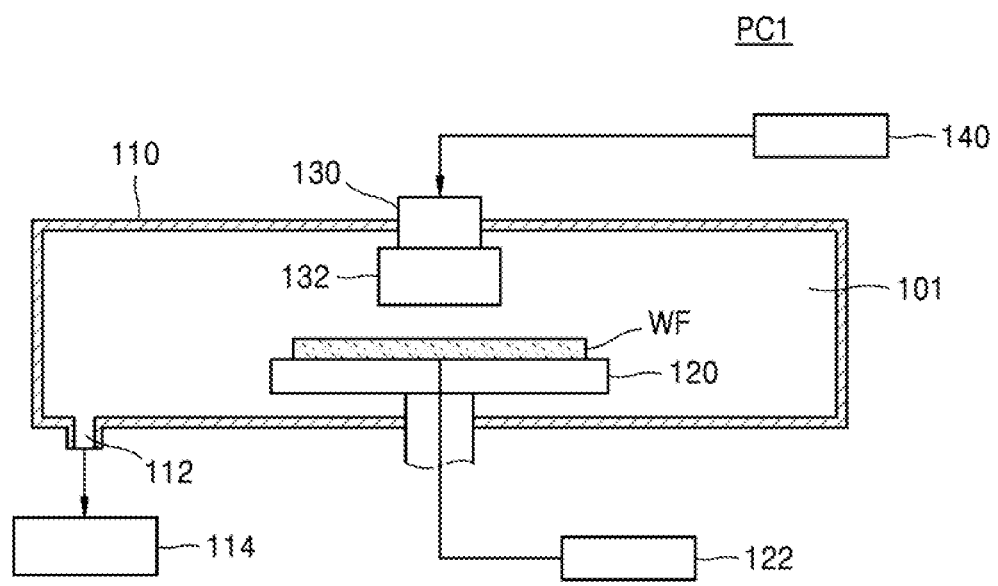
FIG. 3 is a cross-sectional view illustrating a process chamber included in an ALD apparatus according to an exemplary embodiment of the present disclosure.

As shown in FIG. 3, the first process chamber PC1 may be of a single wafer type and may include a housing 110 configured to form a chamber inner region 101. The housing 110 may be configured with a single aluminum block. The housing 110 may include a conduit, and a fluid for controlling a temperature of the housing 110 may flow through the conduit. Also, the first process chamber PC1 may include an exhaust port 112 configured to connect the chamber inner region 101 to a vacuum pump 114.

A substrate support unit 120 may be located near a center of the chamber inner region 101. The substrate support unit 120 may fix and support the substrate WF during a process of inducing adsorption of the first material film (refer to M1 in FIG. 7A). In some exemplary embodiments of the present disclosure, the substrate support unit 120 may include aluminum, ceramic, or a combination of aluminum and ceramic and may include a vacuum unit and a heater 122.

By evacuating a region between the substrate WF and the substrate support unit 120 using the vacuum unit, the substrate WF may be fixed to the substrate support unit 120. The heater 122 may heat the substrate WF located on the substrate support unit 120 to a predetermined temperature.

A mixing block 130 may be located near an upper portion of the housing 110. The mixing block 130 may be connected to a gas supply source 140. In some exemplary embodiments of the present disclosure, individual gases supplied from the gas supply source 140 may be combined in the mixing block 130. The individual gases may be mixed into a single homogeneous gas fluid in the mixing block 130, and the single homogeneous gas fluid may be supplied through a shower head 132 to the chamber inner region 101.

A gas line configured to supply a process gas (e.g., the first source gas GAS1) from the gas supply source 140 to the chamber inner region 101 may include a valve configured to switch the flow of a gas. Also, the gas supply source 140 may be controlled by a gas controller. For example, the gas controller may control the gas supply source 140 and adjust a type, supply start and end points, and flow rate of a gas supplied to the chamber inner region 101.

Figure 4:
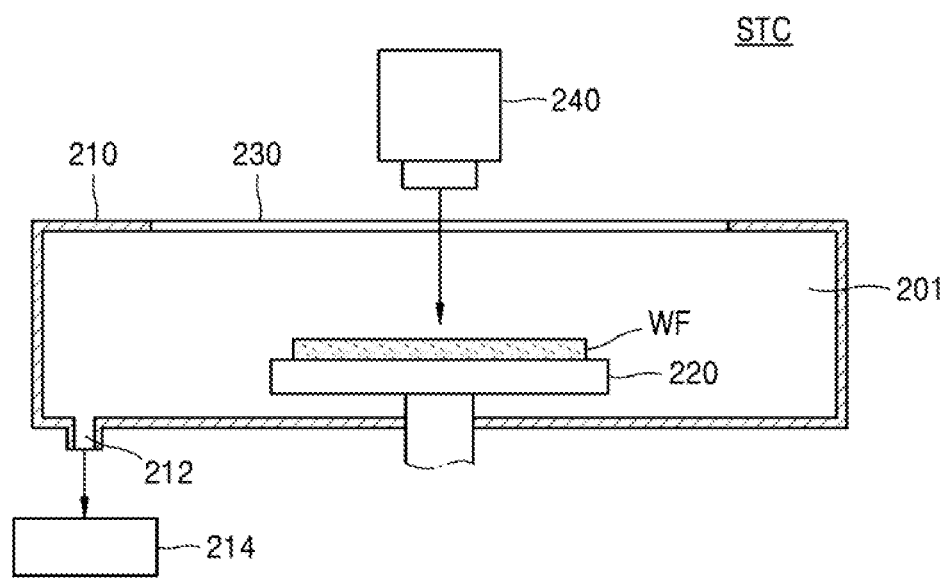
FIG. 4 is a cross-sectional view illustrating a surface treatment chamber included in an ALD apparatus according to an exemplary embodiment of the present disclosure.

As shown in FIG. 4, the surface treatment chamber STC may be of a single wafer type and may include a housing 210 configured to form a chamber inner region 201 therein. The surface treatment chamber STC may include an exhaust port 212 configured to connect the chamber inner region 201 to a vacuum pump 214. Also, as shown in FIG. 1, the surface treatment chamber STC may be located adjacent to each of the first to third process chambers PC1 to PC3 and spaced substantially the same distance apart from each of the first to third process chambers PC1 to PC3.

A substrate support unit 220 may be located near a lengthwise center of the chamber inner region 201. The substrate support unit 220 may fix and support the substrate WF during a surface treatment process.

An optical source irradiation unit 240 may be located over the housing 210. The optical source irradiation unit 240 may irradiate an upper surface of the substrate WF through an upper plate 230 that may include a transparent material and may form an upper portion of the housing 210. The transparent material included in the upper plate 230 may be, for example, quartz, glass, or a plastic. The optical source irradiation unit 240 may produce, for example, infrared (IR) light, ultraviolet (UV) light, or laser light of any frequency/color.

In addition, the optical source irradiation unit 240 may be controlled by an optical source controller. For example, the optical source controller may control the optical source irradiation unit 240 and adjust a type, supply start and end points, and intensity of an optical source supplied to the chamber inner region 201.

Figure 5:
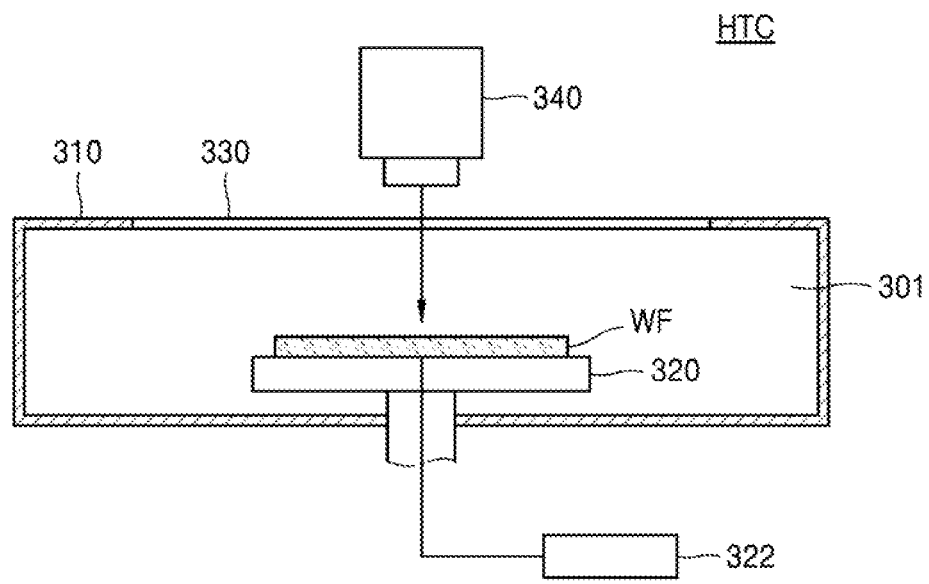
FIG. 5 is a cross-sectional view illustrating a heat treatment chamber included in an ALD apparatus according to an exemplary embodiment of the present disclosure.

As shown in FIG. 5, the heat treatment chamber HTC may be of a single wafer type and may include a housing 310 configured to form a chamber inner region 301 therein. The housing 310 may include a conduit, and a fluid for controlling a temperature of the housing 310 may flow through the conduit.

A substrate support unit 320 may be located near a lengthwise center of the chamber inner region 301. The substrate support unit 320 may fix and support the substrate WF during the heat treatment process. In some exemplary embodiments of the present disclosure, the substrate support unit 320 may include a vacuum unit and a heater 322.

By evacuating a space between the substrate WF and the substrate support unit 320 using the vacuum unit, the substrate WF may be fixed to the substrate support unit 320. The heater 322 may heat the substrate WF located on the substrate support unit 320 to a predetermined temperature.

A temperature of the substrate WF in the heat treatment chamber HTC may be higher than a temperature of the substrate WF in the first to third process chambers PC1 to PC3.

An optical source irradiation unit 340 may be located over the housing 310. The optical source irradiation unit 340 may irradiate an upper surface of the substrate WF through an upper plate 330 that may include a transparent material and form an upper portion of the housing 310. The optical source irradiation unit 340 may produce, for example, IR light, UV light, or laser light of any frequency/color.

In addition, the optical source irradiation unit 340 may be controlled by an optical source controller. For example, the optical source controller may control the optical source irradiation unit 340 and may adjust a type, supply start and end points, and intensity of an optical source supplied to the chamber inner region 301.

A power density of the optical source irradiation unit 340 of the heat treatment chamber HTC may be higher than a power density of the optical source irradiation unit 240 of the surface treatment chamber STC.

Figure 6:
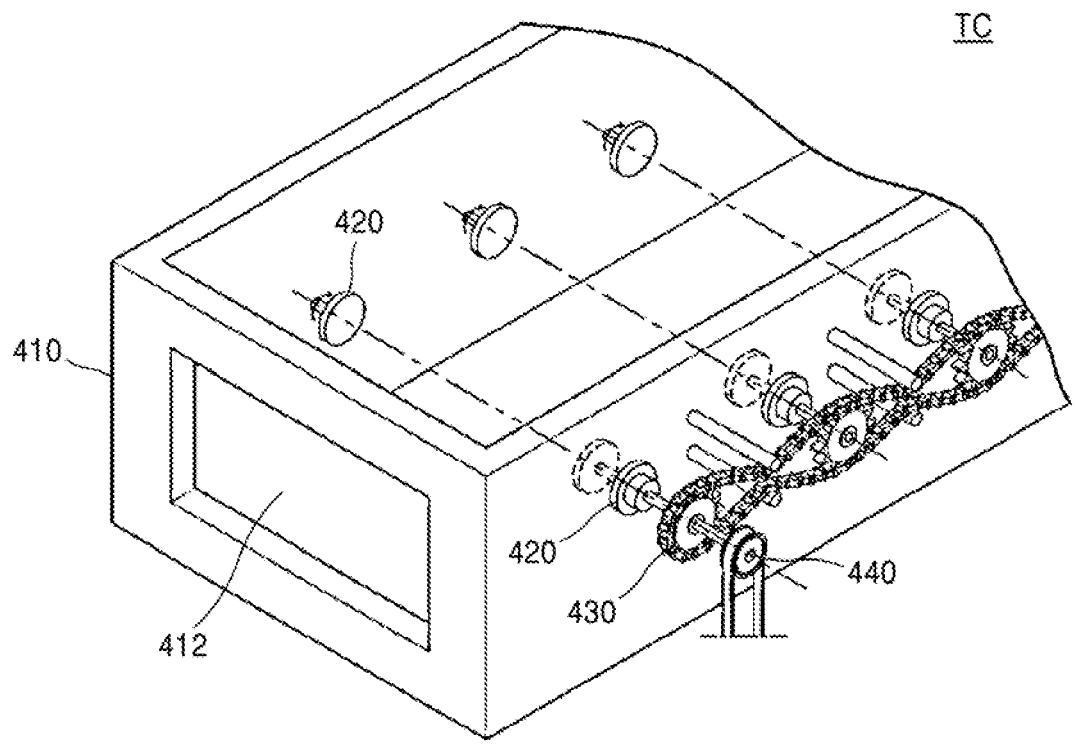
FIG. 6 is a partial perspective view of a transfer chamber included in an ALD apparatus according to an exemplary embodiment of the present disclosure.

As shown in FIG. 6, the transfer chamber TC may include a housing 410, a rotation support unit 420, a chain 430, and a driver 440. The transfer chamber TC may have a structure of a track type, a rail type, or a robot arm type.

The housing 410 may define a space in which the substrate WF (or a tray on which the substrate WF is mounted) may move within a vacuum state. A portion of the housing 410 may include a slit 412 connected to each chamber.

Rotation support units 420 may rotatably support both lower surfaces of the substrate WF and transfer the substrate WF. The rotation support units 420 may be installed on side surfaces of the housing 410 and may face each other in the same central line. The rotation support units 420 may be arranged at regular intervals in a direction in which the substrate WF is transferred.

The chain 430 may be connected to sprockets respectively coupled to the rotation support units 420 so that a plurality of rotation support units 420 may be rotatably interlocked with each other. A tension roller configured to apply pressure to the chain 430 and thereby provide tension may be disposed between the sprockets.

The driver 440 may be configured to receive rotary power of a driving motor, transmit the rotary power to the rotation support unit 420 through a connection member, and distribute the rotary power of the driving motor to both sides using a gear. For example, after the rotary power of the driving motor is distributed to the both sides by the driver 440, a plurality of rotation support units 420 may be rotated in the same direction to transfer the substrate WF.

As shown in FIG. 2, the progress of a process of forming a thin film in the ALD apparatus 10 according to an exemplary embodiment of the present invention may be illustrated with respect to time for each chamber. A case in which the substrate WF is loaded into a chamber and undergoes a process is illustrated with a protrusion (square wave), while a case in which a process is not performed in the chamber is illustrated with a straight line.

Figure 7A:
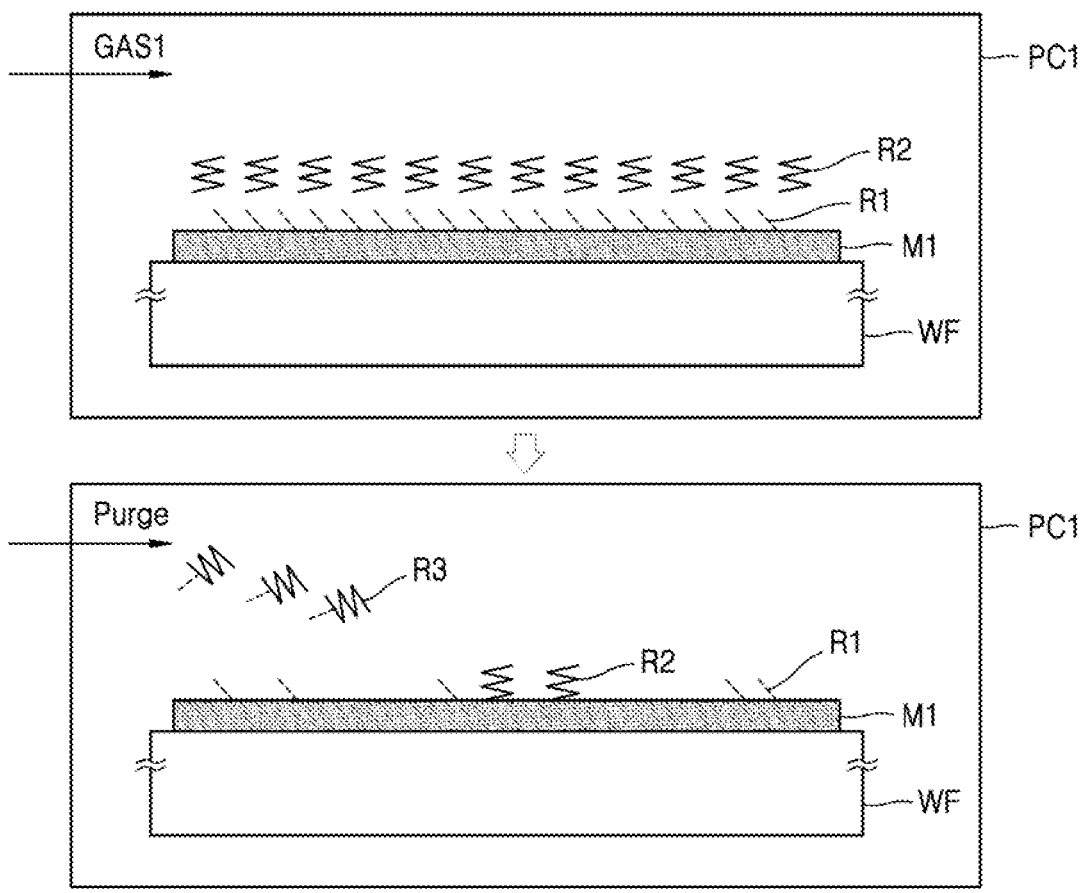
FIGS. 7A to 7G are cross-sectional views illustrating a process of forming a thin film using an ALD apparatus, according to an exemplary embodiment of the present disclosure.

The first source gas GAS1 may be supplied to a substrate WF having a cleaned surface in the first process chamber PC1 to induce the adsorption of the first material film (refer to M1 in FIG. 7A). Thereafter, a surface treatment process for removing the reaction byproduct remaining on the surface of the first material film (refer to M1 in FIG. 7A) may be performed in the surface treatment chamber STC.

Subsequently, the second source gas GAS2 may be supplied to the first material film (refer to M1 in FIG. 7C) in the second process chamber PC2 to induce the adsorption of the second material film (refer to M2 in FIG. 7C). Thereafter, a surface treatment process for removing the reaction byproduct remaining on the surface of the second material film (refer to M2 in FIG. 7C) may be performed in the surface treatment chamber STC.

Figure 7B:
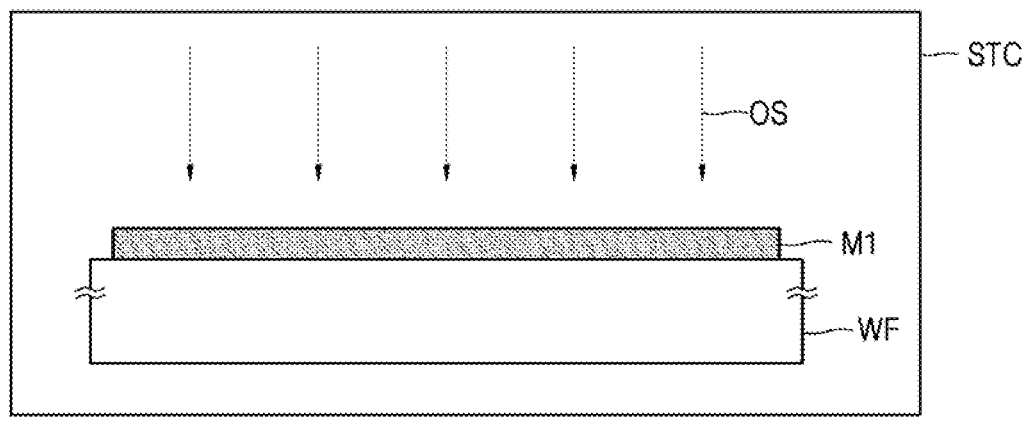
Figure 7C:
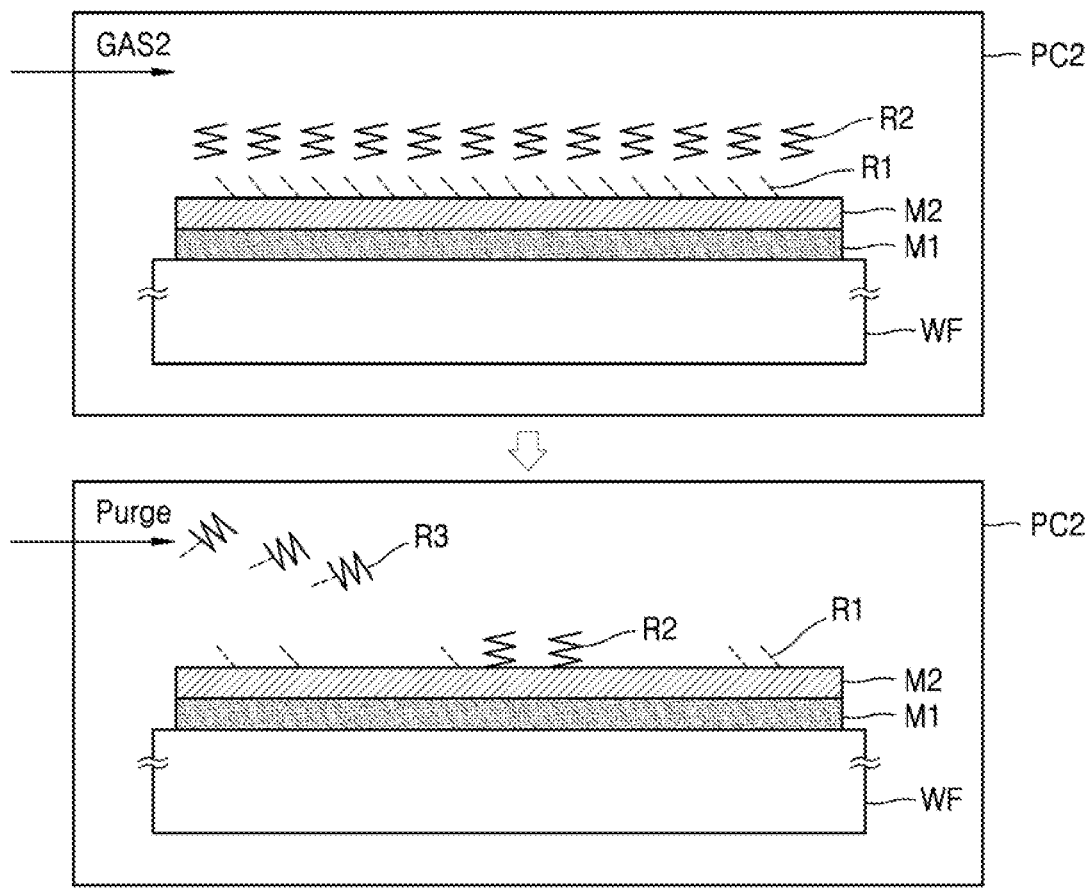
Figure 7D:
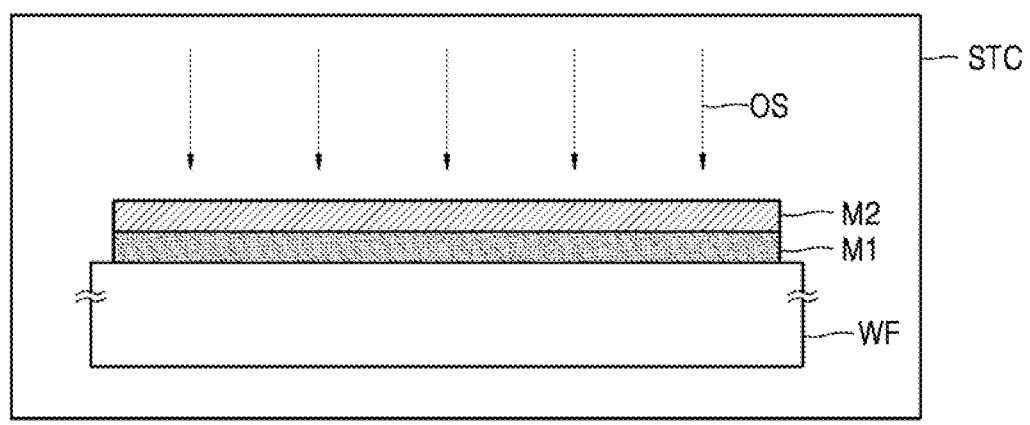
Figure 7E:
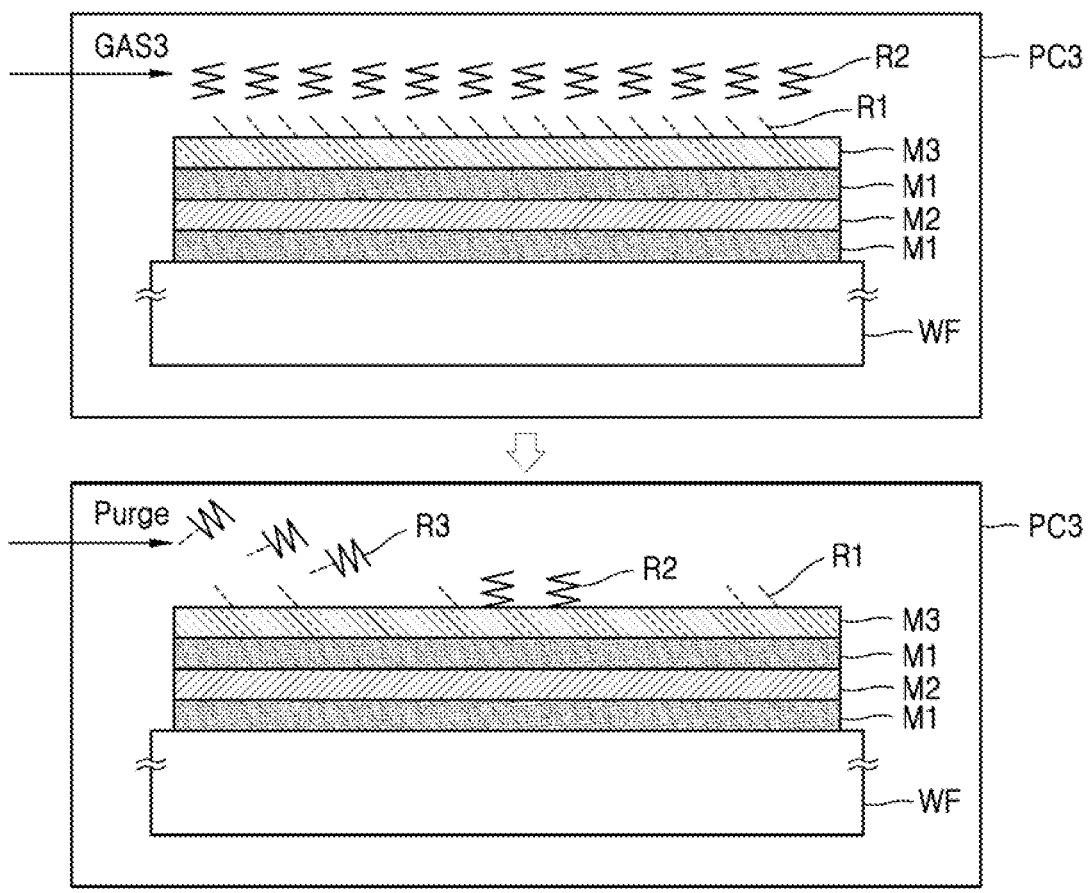

The first source gas GAS1 may be supplied again to the second material film (refer to M2 in FIG. 7E) in the first process chamber PC1 to induce the adsorption of the first material film (refer to M1 in FIG. 7E). Thereafter, a surface treatment process for removing the reaction byproduct remaining on the surface of the first material film (refer to M1 in FIG. 7E) may be performed in the surface treatment chamber STC.

Subsequently, the third source gas GAS3 may be supplied to the first material film (refer to M1 in FIG. 7E) in the third process chamber PC3 to induce the adsorption of the third material film (refer to M3 in FIG. 7E). Thereafter, a surface treatment process for removing the reaction byproduct remaining on the surface of the third material film (refer to M3 in FIG. 7E) may be performed in the surface treatment chamber STC.

The processes of inducing the adsorption of the first to third material films (refer to M1 to M3 in FIGS. 7A to 7E) may be repeated until the first to third material films (refer to M1 to M3 in FIGS. 7A to 7E) may be formed to desired thicknesses.

Figure 7F:
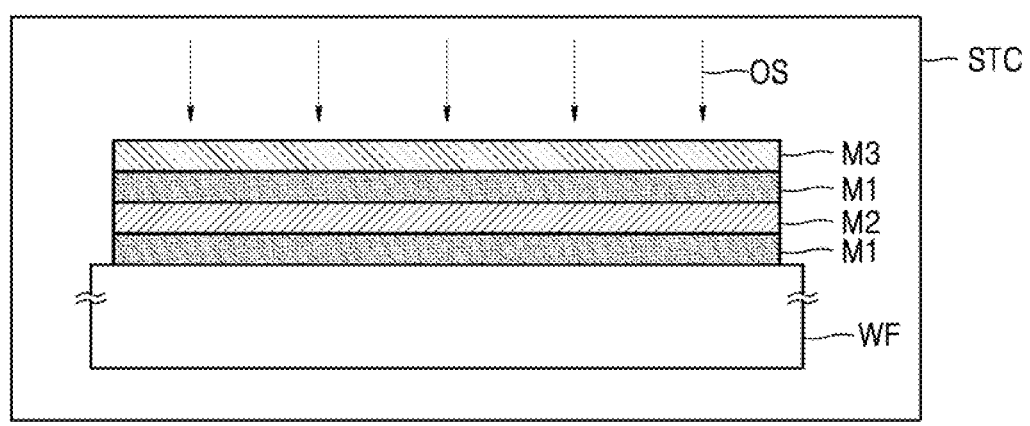
Figure 7G:
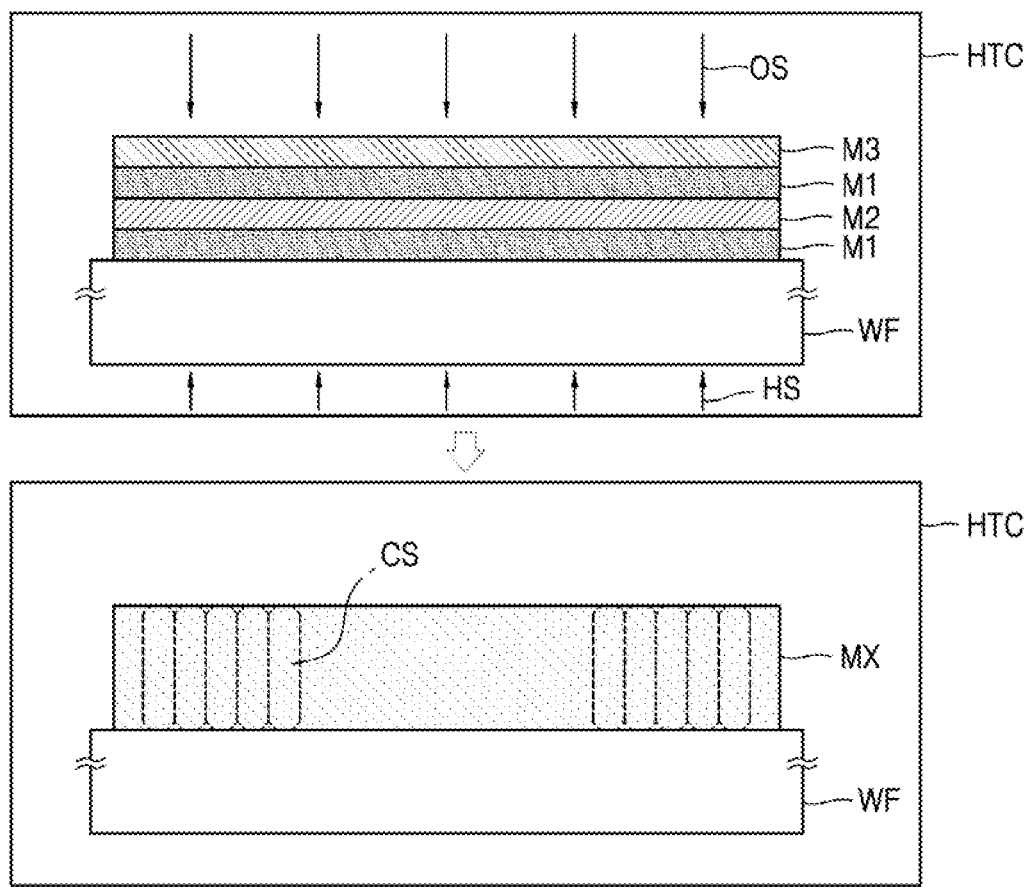

When the first to third material films have been formed to the desired thickness, a heat treatment process may be performed in the heat treatment chamber HTC, on the substrate WF on which the first to third material films (refer to M1 to M3 in FIGS. 7A to 7E) are adsorbed in a predetermined order, so that the first to third material films (refer to M1 to M3 in FIGS. 7A to 7E) may be formed into a single compound thin film (refer to MX in FIG. 7G). The single compound thin film (refer to MX in FIG. 7G) may include a ternary composition, but the inventive concept is not limited thereto.

The processes respectively performed in the first to third process chambers PC1 to PC3, the surface treatment chamber STC, and the heat treatment chamber HTC may each be performed in a vacuum state. Also, the transferring of the substrate WF between the respective processes may be performed in a vacuum state. For example, the process of forming the single compound thin film (refer to MX in FIG. 7G) on the substrate WF may be entirely performed in a vacuum state.

In recent years, the integration density of semiconductor devices has increased. Accordingly, a thickness of a thin film may need to be reduced and patterns may need to be formed more finely. Moreover, a plurality of cells may be highly integrated on a single chip.

For example, when a step is formed on a surface of a semiconductor substrate, it may be necessary to ensure step coverage characteristics and uniformity of a thin film that may conformally cover the surface of the semiconductor substrate. To meet the requirements, an ALD process for forming a thin film having a fine thickness on an atomic level (e.g. a thickness that measures one to one hundred atoms thick) is being employed.

The ALD process may be a method of forming an atomic thin film using a chemisorption process and a desorption process due to a saturated surface reaction of reactants on a surface of a semiconductor substrate. The ALD process may be a thin-film forming process capable of controlling a thickness of a thin film on an atomic level (e.g. on an order of one to one hundred atoms thick). The ALD process may be performed in an ALD apparatus.

In a typical ALD apparatus, which is different from an ALD apparatus according to the inventive concept, at least two source gases may be alternately introduced and reacted on a surface of a semiconductor substrate to form a predetermined thin film. For example, in the typical ALD apparatus, while one source gas is being chemisorbed on the surface of the semiconductor substrate, another source gas may be subsequently provided to the surface of the semiconductor substrate. Thus, a chemical reaction of the at least two source gases may be caused on the surface of the semiconductor substrate so that a thin film may be formed on the surface of the semiconductor substrate. The above-described process may be repeated until the thin film is formed to a desired thickness.

However, the thin film formed using the typical ALD apparatus may have the following shortcomings. During a process of forming a thin film by a chemical reaction of two (or more) source gases, a polycrystalline structure and/or an amorphous structure may be mixed and generated in the thin film so that the thin film may include a phase of an undesired composition. Also, an undesired reaction byproduct may be generated inside the formed thin film and/or on a surface thereof, thereby deteriorating the quality of the thin film. Additionally, since the semiconductor substrate is continuously heated during the process of forming the thin film, a thermal budget of the semiconductor device (e.g. a total level of thermal energy transferred to the semiconductor device) may be affected.

Accordingly, the ALD apparatus 10, according to an exemplary embodiment of the present disclosure, may effectively block an undesired reaction byproduct, which may otherwise be trapped in the thin film, using a surface treatment process, and may simultaneously perform a heat treatment process at a final stage on thin films adsorbed in a predetermined order. Therefore, the formation of a phase of an undesired composition may be prevented and a thermal budget may be managed, thus increasing the quality of a thin film used for a semiconductor device.

According to exemplary embodiments of the present disclosure, the ALD apparatus 10 may form a thin film having excellent quality to increase the reliability and productivity of the semiconductor device.

FIGS. 7A to 7G are cross-sectional views of a process of forming a thin film using an ALD apparatus 10, according to an exemplary embodiment of the present disclosure.

Referring to FIG. 7A, in a first process chamber PC1, a first source gas GAS1 for forming a first material film M1 on a substrate WF may be sprayed for a predetermined time, and a purge gas may be then sprayed.

A first material film M1 including a plurality of unit particles may be formed on the substrate WF. Unit particles, which are in direct contact with the substrate WF, from among the plurality of unit particles, may be chemically bonded to the substrate WF. Unit particles, which are not in direct contact with the substrate WF but are rather in contact with other unit particles, from among the plurality of unit particles, may be physically bonded to each other. Bonds amongst the unit particles may be weaker than bonds between the substrate WF and the unit particles. For example, the bonds between the substrate WF and the unit particles may be stronger than the bonds amongst the unit particles.

In some exemplary embodiments of the present disclosure, the first source gas GAS1 may include a reaction precursor. The reaction precursor may include, for example, a silicon precursor having a ligand R1 bonded to a silicon (Si) atom as a central atom. The silicon precursor may be, for example, tetrakis ethyl methyl amino silicon (TEMAS), tetrakis di-methyl amino silicon (TDMAS), or tetrakis di-ethyl amino silicon (TDEAZ). In some exemplary embodiments of the present disclosure, the first source gas GAS1 may be introduced along with a carrier gas into the first process chamber PC1. For example, the carrier gas may include an inert gas, such as argon (Ar), helium (He), krypton (Kr), and xenon (Xe).

In some exemplary embodiments of the present disclosure, an inner temperature of the first process chamber PC1 may be maintained in a range of about 200° C. to about 300° C. When the reaction precursor includes a silicon precursor, the reaction precursor may be maintained in a higher temperature range than when the reaction precursor includes other precursors.

The first source gas GAS1 may be supplied into the first process chamber PC1 so that adsorption between the reaction precursor and the substrate WF may be induced in the temperature range. Thus, the first material film M1 may be formed on an atomic level (e.g. with a thickness on the order of 1 to 100 atoms) on a surface of the substrate WF. In some exemplary embodiments of the present disclosure, when the silicon precursor is used as the reaction precursor, the first material film M1 may be substantially implemented as a silicon atomic layer. In other embodiments, when a metal precursor is used as the reaction precursor, the first material film M1 may be substantially implemented as a metal atomic layer. Meanwhile, the ligand R1 bonded to the silicon atom may be pyrolyzed and may be separated from the silicon atom. The first source gas GAS1 may include a functional group R2, which may be bonded to the ligand R1 to generate a byproduct R3.

A purge process may be performed by introducing the purge gas into the first process chamber PC1. The reaction precursor that is not adsorbed on the substrate WF may be removed due to the purge process. Also, the ligand R1, the functional group R2, and the byproduct R3 may be removed together. The purge gas may include, for example, nitrogen gas ($N_2$).

However, the ligand R1 and the functional group R2, which are not removed due to the purge gas, may still remain in the form of a reaction byproduct on a surface of the first material film M1. The reaction byproduct may remain unremoved in subsequent processes and deteriorate the quality of the thin film.

Referring to FIG. 7B, the surface of the first material film M1 may be treated by means of a surface treatment process using an optical source OS.

The surface treatment process may completely remove the reaction byproduct, which might not be removed using the purge process but rather attached to the surface of the first material film M1. For example, the surface treatment process may provide predetermined energy to the surface of the first material film M1 using IR light, UV light, or laser light of any frequency/color as the optical source OS and break bonding energy between the first material film M1 and the reaction byproduct to remove the reaction byproduct.

Due to the surface treatment process, the first material film M1 may include an atomic thin film composed of only central atoms. Dangling bonds that are not bonded to other elements may be exposed on the surface of the first material film M1. Accordingly, the surface treatment process may be performed in a vacuum state, and the transferring of the substrate WF on which the surface treatment process is completely performed may also be performed in a vacuum state.

Referring to FIG. 7C, in a second process chamber PC2, a second source gas GAS2 for forming a second material film M2 on the first material film M1 may be sprayed for a predetermined time, and a purge gas may then be sprayed.

The second material film M2, which may be composed of a plurality of unit particles, may be formed on the first material film M1. In some exemplary embodiments of the present disclosure, the second source gas GAS2 may include a reaction precursor. The reaction precursor may have a ligand R1 bonded to a central atom. In some exemplary embodiments of the present disclosure, the second source gas GAS2 may be introduced along with a carrier gas into the second process chamber PC2.

In some exemplary embodiments of the present disclosure, an internal temperature of the second process chamber PC2 may be maintained in a range of about 200° C. to about 300° C. The second source gas GAS2 may be supplied into the second process chamber PC2 so that adsorption between the reaction precursor and the first material film M1 may be induced in the temperature range. Thus, a second material film M2 may be formed on an atomic level (e.g. on an order of 1 to 100 atoms thick) on the surface of the first material film M1.

The second source gas GAS2 may include a functional group R2, which may be bonded to the ligand R1 to generate a byproduct R3.

A purge process may be performed by introducing the purge gas into the second process chamber PC2. The reaction precursor that is not adsorbed on the first material film M1 may be removed due to the purge process. Also, the ligand R1, the functional group R2, and the byproduct R3 may be removed together. However, the ligand R1 and the functional group R2, which are not removed due to the purge process, may still remain in the form of a reaction byproduct on a surface of the second material film M2.

Referring to FIG. 7D, the surface of the second material film M2 may be treated by means of a surface treatment process using an optical source OS.

The surface treatment process may completely remove the reaction byproduct, which might not be removed using the purge process but is rather attached to the surface of the second material film M2.

Referring to FIG. 7E, a first material film M1 may be formed again on the second material film M2. Thereafter, in a third process chamber PC3, a third source gas GAS3 for forming a third material film M3 on the first material film M1 may be sprayed for a predetermined time, and a purge gas may be then sprayed.

A third material film M3, including a plurality of unit particles, may be formed on the first material film M1. In some exemplary embodiments of the present disclosure, the third source gas GAS3 may include a reaction precursor. The reaction precursor may have a ligand R1 bonded to a central atom. In some exemplary embodiments of the present disclosure, the third source gas GAS3 may be introduced along with a carrier gas into the third process chamber PC3.

In some exemplary embodiments of the present disclosure, an internal temperature of the third process chamber PC3 may be maintained in a range of about 200° C. to about 300° C. The third source gas GAS3 may be supplied into the third processor chamber PC3 so that adsorption of the reaction precursor on the first material film M1 may be induced in the temperature range. Thus, a third material film M3 may be formed on an atomic level on a surface of the first material film M1.

The third source gas GAS3 may include a functional group R2, which may be bonded to the ligand R1 to generate a byproduct R3.

A purge process may be performed by introducing the purge gas into the third process chamber PC3. The reaction precursor that is not adsorbed on the first material film M1 may be removed due to the purge process. Also, the ligand R1, the functional group R2, and the byproduct R3 may be removed together. However, the ligand R1 and the functional group R2, which are not removed due to the purge process, may still remain in the form of a reaction byproduct on a surface of the third material film M3.

Referring to FIG. 7F, the surface of the third material film M3 may be treated by means of a surface treatment process using an optical source OS.

The surface treatment process may completely remove the reaction byproduct, which might not be removed using the purge process but is rather attached to the surface of the third material film M3.

Referring to FIG. 7G, a heat treatment process may be performed on the substrate WF on which the first to third material films (refer to M1 to M3 in FIG. 7F) are adsorbed in a predetermined order, to form a single compound thin film MX.

The heat treatment process may result in conversion of unconverted interatomic bonds into chemical bonds in the first to third material films (refer to M1 to M3 in FIG. 7F), thereby forming the single compound thin film MX. The single compound thin film MX may include a ternary composition, but the inventive concept is not limited thereto.

The heat treatment process may use the optical source OS and a heat source HS at the same time. The heat treatment process may be performed in a heat treatment chamber, which may be different from a process chamber and a surface treatment chamber. In some exemplary embodiments of the present disclosure, the heat treatment process may be performed at a temperature of about 350° C. to about 550° C. A time interval between heat treatment processes may vary according to a thickness of the single compound thin film MX.

In some exemplary embodiments of the present disclosure, after the heat treatment process, the single compound thin film MX may be implemented as a silicon oxynitride film. The single compound thin film MX may have a crystalline structure with a columnar structure (CS). For example, by simultaneously performing the heat treatment process at a final stage on the first to third material films (refer to M1 to M3 in FIG. 7F) adsorbed in the predetermined order, the formation of a phase of an undesired composition may be prevented. In addition, since the heat treatment process is performed at a relatively low temperature as compared with a typical ALD apparatus, problems associated with a heat treatment process performed at a high temperature may be reduced.

Figure 8:
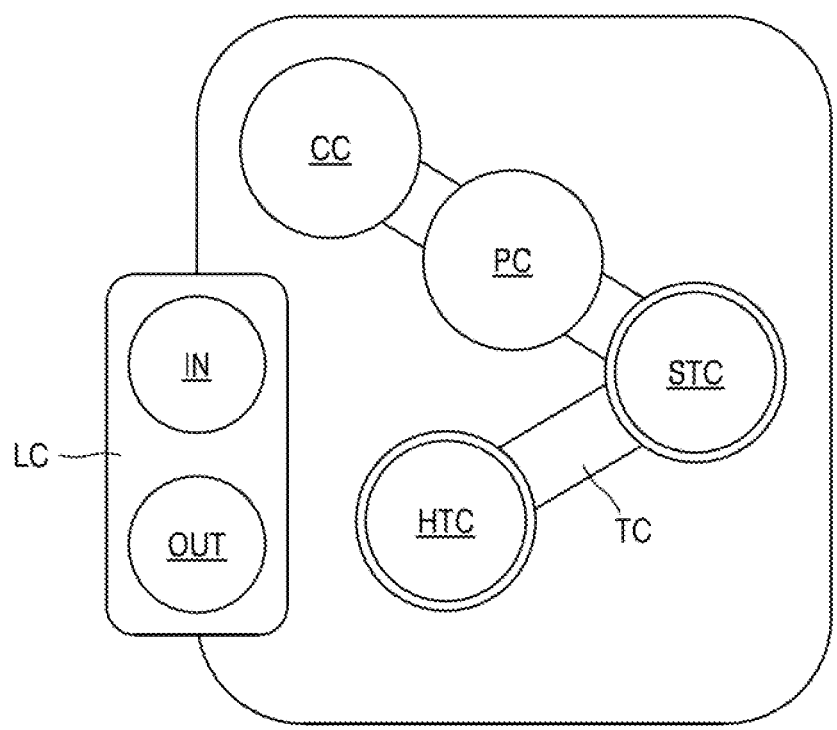
FIG. 8 is a schematic diagram illustrating an ALD apparatus according to an exemplary embodiment of the present disclosure.
Figure 9:
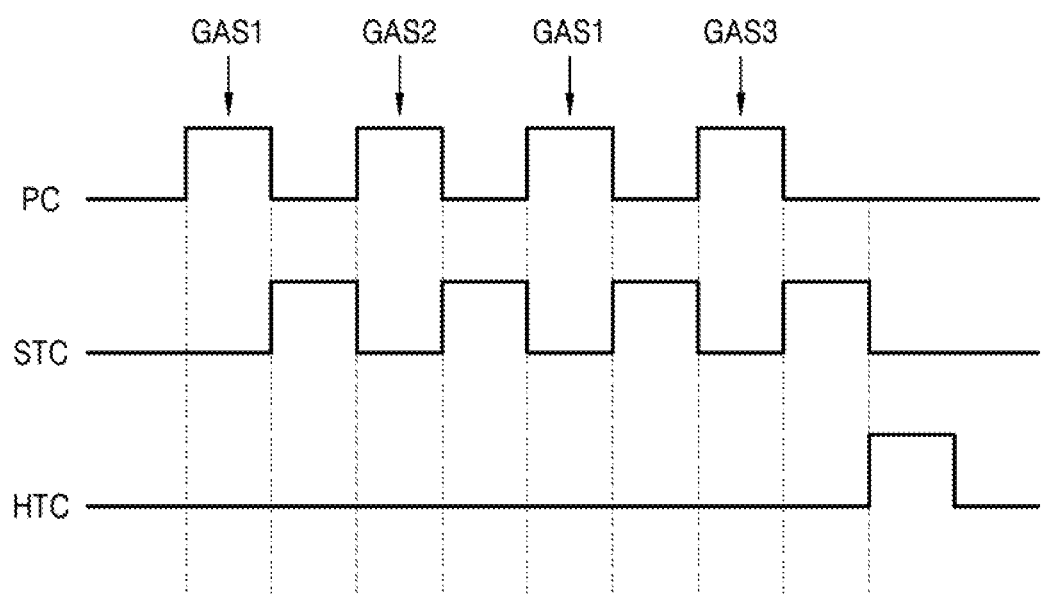
FIG. 9 is a waveform diagram showing a process of operating an ALD apparatus according to an exemplary embodiment of the present disclosure.
Figure 10:
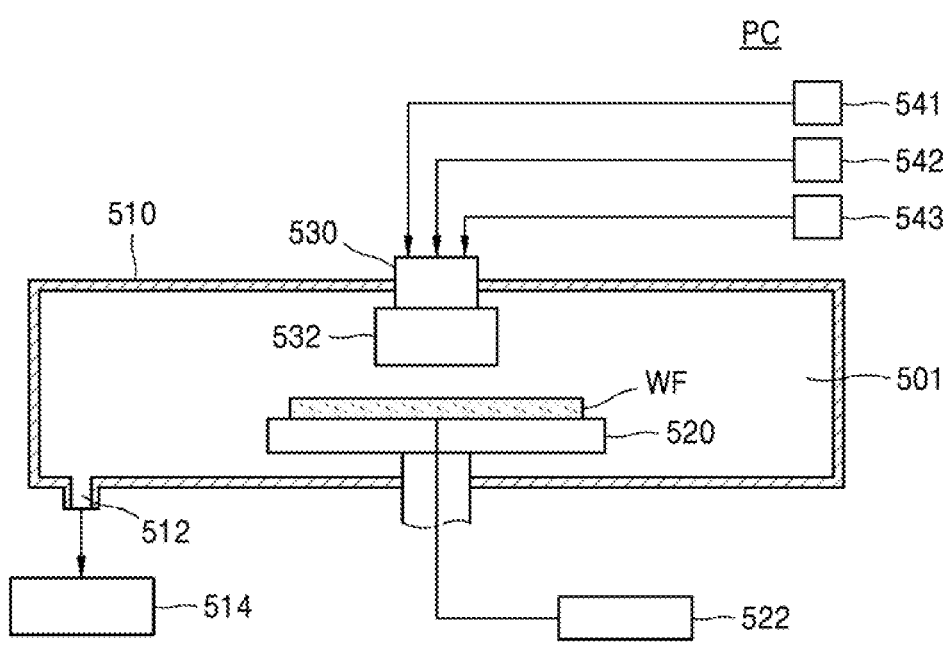
FIG. 10 is a cross-sectional view illustrating a process chamber included in an ALD apparatus according to an exemplary embodiment of the present disclosure.

FIG. 8 is a schematic diagram of an ALD apparatus 20 according to an exemplary embodiment of the present disclosure. FIG. 9 is a waveform diagram showing a process of operating the ALD apparatus 20. FIG. 10 is a cross-sectional view of a process chamber included in the ALD apparatus 20.

Respective components of the ALD apparatus 20 described below and functions of the components may be substantially the same as or similar to those of the ALD apparatus 10 described above with reference to FIGS. 1 to 6. Thus, differences between the ALD apparatus 20 and the ALD apparatus 10 will mainly be described for brevity. It is to be assumed that to the extent that a detailed description of functions and components is omitted, these functions and components may be at least similar to corresponding functions and components that have already been described.

Referring to FIGS. 8 to 10, the ALD apparatus 20 may include a load lock chamber LC including a loading chamber IN configured to load a substrate WF and an unloading chamber OUT configured to unload the substrate WF, a cleaning chamber CC configured to clean a surface of the substrate WF, a process chamber PC configured to induce the adsorption of a material film on the substrate WF, a surface treatment chamber STC configured to perform a surface treatment process on the adsorbed material film, a heat treatment chamber HTC configured to perform a heat treatment process on material films that are adsorbed in a predetermined order, and a transfer chamber TC configured to transfer the substrate WF to each chamber.

Since the load lock chamber LC, the cleaning chamber CC, the surface treatment chamber STC, the heat treatment chamber HTC, and the transfer chamber TC shown in FIG. 8 are substantially the same as or similar to those of the ALD apparatus (refer to 10 in FIGS. 1 to 6), detailed descriptions thereof will be omitted. It is to be assumed that to the extent that a detailed description of these elements is omitted, these elements may be at least similar to corresponding elements that have already been described.

As shown in FIG. 10, the process chamber PC may supply different source gases (e.g., first to third source gases GAS1 to GAS3) to the substrate WF and induce the adsorption of different material films, for example, first to third material films (refer to M1 to M3 in FIGS. 7A to 7E).

The process chamber PC may be of a single wafer type and include a housing 510 configured to form a chamber inner region 501. The housing 510 may include a conduit, and a fluid for controlling a temperature of the housing 510 may flow through the conduit. Also, the process chamber PC may include an exhaust port 512 configured to connect the chamber inner region 501 to a vacuum pump 514.

The substrate support unit 520 may be disposed near a center of the chamber inner region 501. In some exemplary embodiments of the present disclosure, the substrate support unit 520 may include a vacuum unit and a heater 522.

A mixing block 530 may be located near an upper portion of the housing 510. The mixing block 530 may be connected to first to third gas supply sources 541 to 543. In some exemplary embodiments of the present disclosure, individual gases supplied from the first to third gas supply sources 541 to 543 may be combined in the mixing block 530. The individual gases may be mixed into a single homogeneous gas fluid in the mixing block 530, and the single homogeneous gas fluid may be supplied through a shower head 532 to the chamber inner region 501.

A gas line configured to supply the first source gas GAS1 from the first gas supply source 541 to the chamber inner region 501 may include a first valve configured to switch the flow of gas. A gas line configured to supply the second source gas GAS2 from the second gas supply source 542 to the chamber inner region 501 may include a second valve. A gas line configured to supply the third source gas GAS3 from the third gas supply source 543 to the chamber inner region 501 may include a third valve.

In addition, each of the first to third gas supply sources 541 to 543 may be controlled by a gas controller. For example, the gas controller may control the first to third gas supply sources 541 to 543 and adjust a type, supply start and end points, and flow rate of a gas supplied to the chamber inner region 501.

As shown in FIG. 9, the progress of a process of forming a thin film in the ALD apparatus 20 according to the embodiment may be illustrated with respect to time for each chamber.

The first source gas GAS1 may be supplied from the first gas supply source 541 to a substrate WF having a cleaned surface in the process chamber PC to induce the adsorption of the first material film (refer to M1 in FIG. 7A). Thereafter, a surface treatment process for removing the remaining reaction byproduct may be performed in the surface treatment chamber STC.

Subsequently, the second source gas GAS2 may be supplied from the second gas supply line 542 to the first material film (refer to M1 in FIG. 7C) in the process chamber PC to induce the adsorption of the second material film (refer to M2 in FIG. 7C). Thereafter, a surface treatment process for removing the remaining reaction byproduct may be performed in the surface treatment chamber STC.

The first source gas GAS1 may be supplied again from the first gas supply line 541 to the second material film (refer to M2 in FIG. 7E) in the process chamber PC to induce the adsorption of the first material film (refer to M1 in FIG. 7E). Thereafter, a surface treatment process for removing the remaining reaction byproduct may be performed in the surface treatment chamber STC.

Subsequently, the third source gas GAS3 may be supplied from the third gas supply source 543 to the first material film (refer to M1 in FIG. 7E) in the process chamber PC to induce the adsorption of the third material film (refer to M3 in FIG. 7E). Thereafter, a surface treatment process for removing the remaining reaction byproduct may be performed in the surface treatment chamber STC.

The processes of inducing the adsorption of the first to third material films (refer to M1 to M3 in FIGS. 7A to 7E) may be repeated until the first to third material films (refer to M1 to M3 in FIGS. 7A to 7E) may be formed in a predetermined order to have desired thicknesses.

When the first to third material films have been formed in the predetermined order to have the desired thickness, a heat treatment process may be performed, in a heat treatment chamber HTC, on the substrate WF on which the first to third material films (refer to M1 to M3 in FIGS. 7A to 7C) are adsorbed in a predetermined order, so that the first to third material films (refer to M1 to M3 in FIGS. 7A to 7E) may be formed into a single compound thin film (refer to MX in FIG. 7G).

Figure 11:
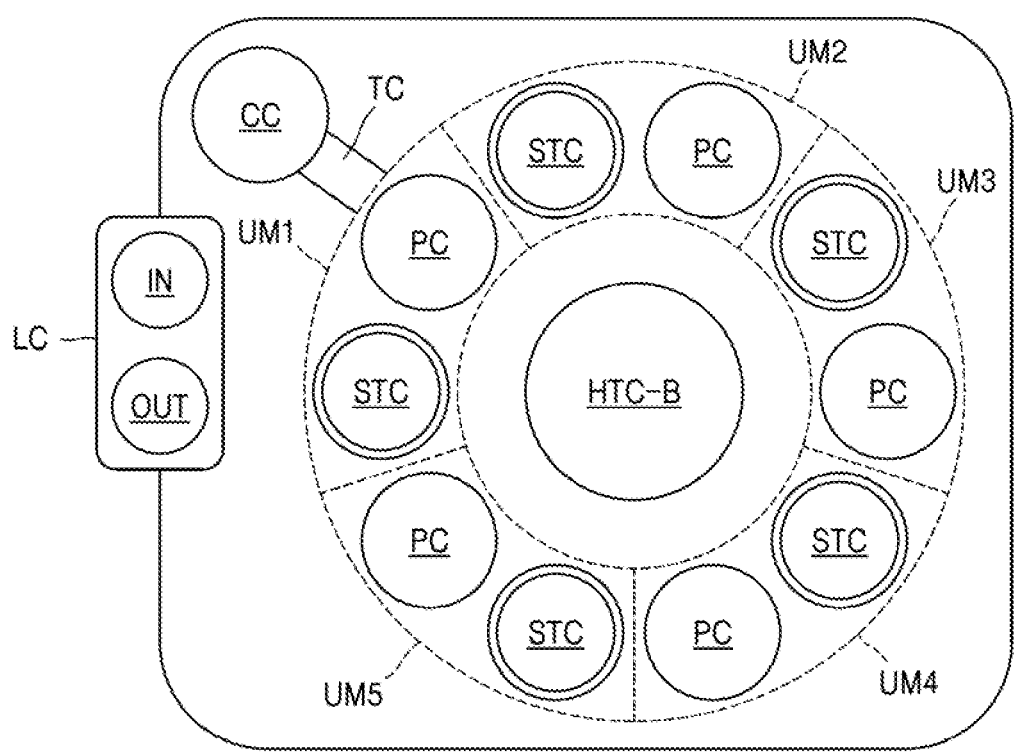
FIG. 11 is a schematic diagram of an ALD apparatus according to an exemplary embodiment of the present disclosure.
Figure 12:
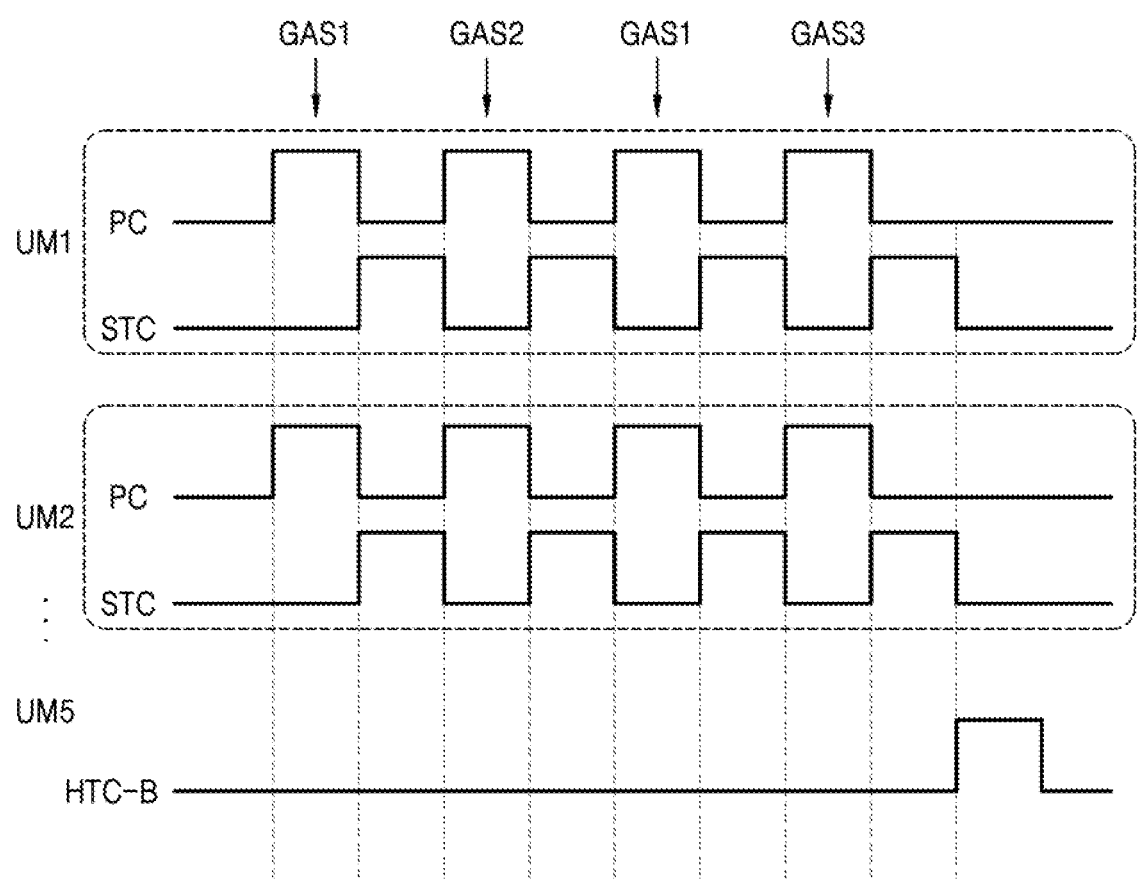
FIG. 12 is a waveform diagram showing a process of operating an ALD apparatus according to an exemplary embodiment of the present disclosure.
Figure 13:
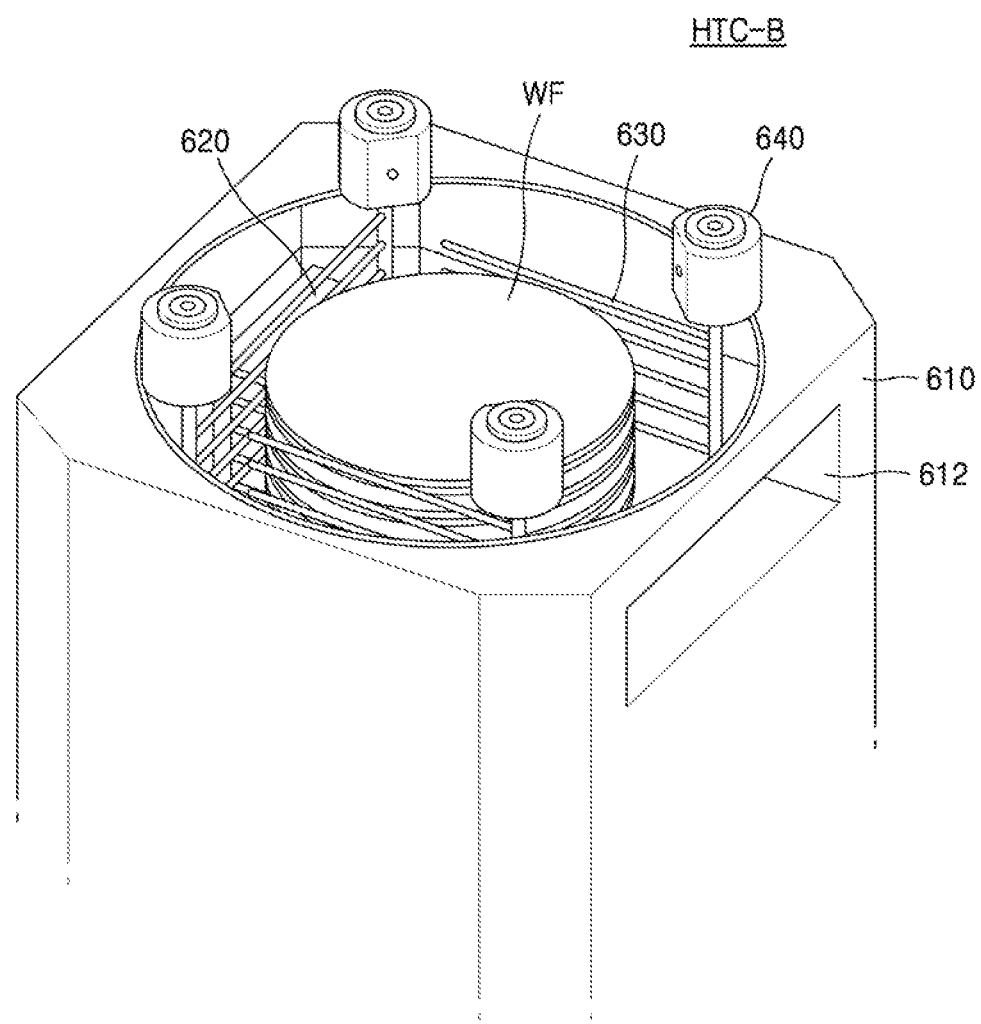
FIG. 13 is a partial perspective view illustrating a heat treatment chamber included in an ALD apparatus according to an exemplary embodiment of the present disclosure.

FIG. 11 is a schematic diagram of an ALD apparatus 30 according to an exemplary embodiment of the present disclosure. FIG. 12 is a waveform diagram showing a process of operating the ALD apparatus 30. FIG. 13 is a partial perspective view of a heat treatment chamber included in the ALD apparatus 30.

Respective components of the ALD apparatus 30 described below and functions of the components may be substantially the same as or similar to those of the ALD apparatus 10 described above with reference to FIGS. 1 to 6 and those of the ALD apparatus 20 described above with reference to FIGS. 8 to 10. Thus, differences between the ALD apparatus 30 and the ALD apparatuses 10 and 20 will mainly be described for brevity. It is to be assumed that to the extent that a detailed description of these elements is omitted, these elements may be at least similar to corresponding elements that have already been described.

Referring to FIGS. 11 to 13, the ALD apparatus 30 may include a load lock chamber LC including a loading chamber IN configured to load a substrate WF and an unloading chamber OUT configured to unload the substrate WF, a cleaning chamber CC configured to clean a surface of the substrate WF, first to fifth unit modules UM1 to UM5, each of which includes a process chamber PC and a surface treatment chamber STC, a heat treatment chamber HTC-B configured to perform a heat treatment process on material films that are adsorbed in a predetermined order, and a transfer chamber TC configured to transfer the substrate WF to each chamber.

Since the load lock chamber LC, the cleaning chamber CC, and the transfer chamber TC shown in FIG. 11 are substantially the same as or similar to those of the ALD apparatus (refer to 10 in FIGS. 1 to 6), detailed descriptions thereof will be omitted. It is to be assumed that to the extent that a detailed description of these elements is omitted, these elements may be at least similar to corresponding elements that have already been described.

Each of the first to fifth unit modules UM1 to UM5 may include a process chamber PC and a surface treatment chamber STC. Since the process chamber PC and the surface treatment chamber STC are substantially the same as or similar to those of the ALD apparatus (refer to 20 in FIGS. 8 to 10), detailed descriptions thereof will be omitted. It is to be assumed that to the extent that a detailed description of these elements is omitted, these elements may be at least similar to corresponding elements that have already been described.

The first to fifth unit modules UM1 to UM5 may be arranged in a circular form around the heat treatment chamber HTC-B. Each of the first to fifth unit modules UM1 to UM5 may be of a single wafer type, and the heat treatment chamber HTC-B may be of a batch type.

For example, the first to third material films (refer to M1 to M3 in FIGS. 7A to 7E) may be adsorbed in a predetermined order on a single substrate WF in each of the first to fifth unit modules UM1 to UM5, and a plurality of substrates WF provided by the first to fifth unit modules UM1 to UM5 may be transferred to the heat treatment chamber HTC-B so that a heat treatment process may be performed as a batch type.

In some exemplary embodiments of the present disclosure, each of the substrates WF may be subjected to processes only in the process chamber PC and the surface treatment chamber STC included in one unit module (any one of the first to fifth unit modules UM1 to UM5). In other embodiments, each of the substrates WF may be subjected to processes while moving clockwise or counterclockwise in both the process chamber PC and the surface treatment chamber STC of each of the first to fifth unit modules UM1 to UM5.

The number of first to fifth unit modules UM1 to UM5 may be exemplary and the present invention is not limited thereto.

As shown in FIG. 13, the heat treatment chamber HTC-B may be of a batch type. For example, the heat treatment chamber HTC-B may simultaneously perform a one-time heat treatment process on a plurality of substrates WF provided by the first to fifth unit modules UM1 to UM5.

In the heat treatment chamber HTC-B, a heater unit 630 may be located between the plurality of substrates WF, which may be vertically stacked and supported by a splitter 620 in a housing 610.

The housing 610 may provide an airtight space isolated from the outside. The heat treatment chamber HTC-B may be formed so that the first to fifth unit modules UM1 to UM5 configured to provide the substrates WF may be connected as a cluster type around the heat treatment chamber HTC-B. The plurality of substrates WF respectively provided by the first to fifth unit modules UM1 to UM5 may be mounted on the splitter 620 by the transfer chamber TC. The plurality of substrates WF may be introduced into the housing 610 through a slit 612, which may be opened and closed off between the housing 610 and the transfer chamber TC.

The heat treatment chamber HTC-B may include a heater unit 630, which is a heating apparatus configured to heat the inside of the housing 610 to a temperature of about 100° C. to about 600° C. Also, the heat treatment chamber HTC-B may include a cooling unit configured to cool the inside of the housing 610 should it exceed a desired temperature.

The splitter 620 may support the plurality of substrates WF at regular intervals in a central portion of the housing 610. The splitter 620 may be arranged in a multi-layered stack structure having a predetermined interval while supporting the plurality of substrates WF horizontally on a flat plate. The splitter 620 may individually support the plurality of substrates WF.

A plurality of heater controllers 640 may be arranged to correspond to corners of a square, which are arranged the same distance apart from each other around the plurality of substrates WF. The plurality of heater controllers 640 may control the heater unit 630 to provide substantially the same heat source to the plurality of substrates WF.

As shown in FIG. 12, the progress of a process of forming a thin film in the ALD apparatus 20, according to exemplary embodiments of the present disclosure, may be illustrated with respect to time for each of chambers included in the first to fifth unit modules UM1 to UM5. Since the progress of the process of forming the thin film in the third to fifth unit modules UM3 to UM5 is substantially the same as in the first and second unit modules UM1 and UM2, the illustrations thereof are omitted.

A first source gas GAS1 may be supplied from a first gas supply source to a substrate WF having a cleaned surface in a process chamber PC of each of the first to fifth unit modules UM1 to UM5, so the adsorption of the first material film (refer to M1 in FIG. 7A) may be induced. Thereafter, a surface treatment process may be performed to remove a reaction byproduct remaining in a surface treatment chamber STC of each of the first to fifth unit modules UM1 to UM5.

Subsequently, a second source gas GAS2 may be supplied from a second gas supply source to the first material film (refer to M1 in FIG. 7C) in the process chamber PC of each of the first to fifth unit modules UM1 to UM5, so the adsorption of the second material film (refer to M2 in FIG. 7C) may be induced. Thereafter, a surface treatment process may be performed to remove a reaction byproduct remaining in the surface treatment chamber STC of each of the first to fifth unit modules UM1 to UM5.

The first source gas GAS1 may be supplied again from the first gas supply source to the second material film (refer to M2 in FIG. 7E) in the process chamber PC of each of the first to fifth unit modules UM1 to UM5, so the adsorption of the first material film (refer to M1 in FIG. 7E) may be induced. Thereafter, a surface treatment process may be performed to remove a reaction byproduct remaining in the surface treatment chamber STC of each of the first to fifth unit modules UM1 to UM5.

Subsequently, a third source gas GAS3 may be supplied from a third gas supply source to the first material film (refer to M1 in FIG. 7E) in the process chamber PC of each of the first to fifth unit modules UM1 to UM5, so the adsorption of the third material film (refer to M3 in FIG. 7E) may be induced. Thereafter, a surface treatment process may be performed to remove a reaction byproduct remaining in the surface treatment chamber STC of each of the first to fifth unit modules UM1 to UM5.

The processes of inducing the adsorption of the first to third material films (refer to M1 to M3 in FIGS. 7A to 7E) may be repeated until the first to third material films (refer to M1 to M3 in FIGS. 7A to 7E) may be formed in a predetermined order to have desired thicknesses.

When the first to third material films have been formed in the predetermined order to have the desired thickness, a heat treatment process may be performed on a plurality of substrates WF on which the first to third material films (refer to M1 to M3 in FIGS. 7A to 7E) are adsorbed in a predetermined order, in a heat treatment chamber HTC, so that the first to third material films (refer to M1 to M3 in FIGS. 7A to 7E) may be formed into a single compound thin film (refer to MX in FIG. 7G).

Figure 14:
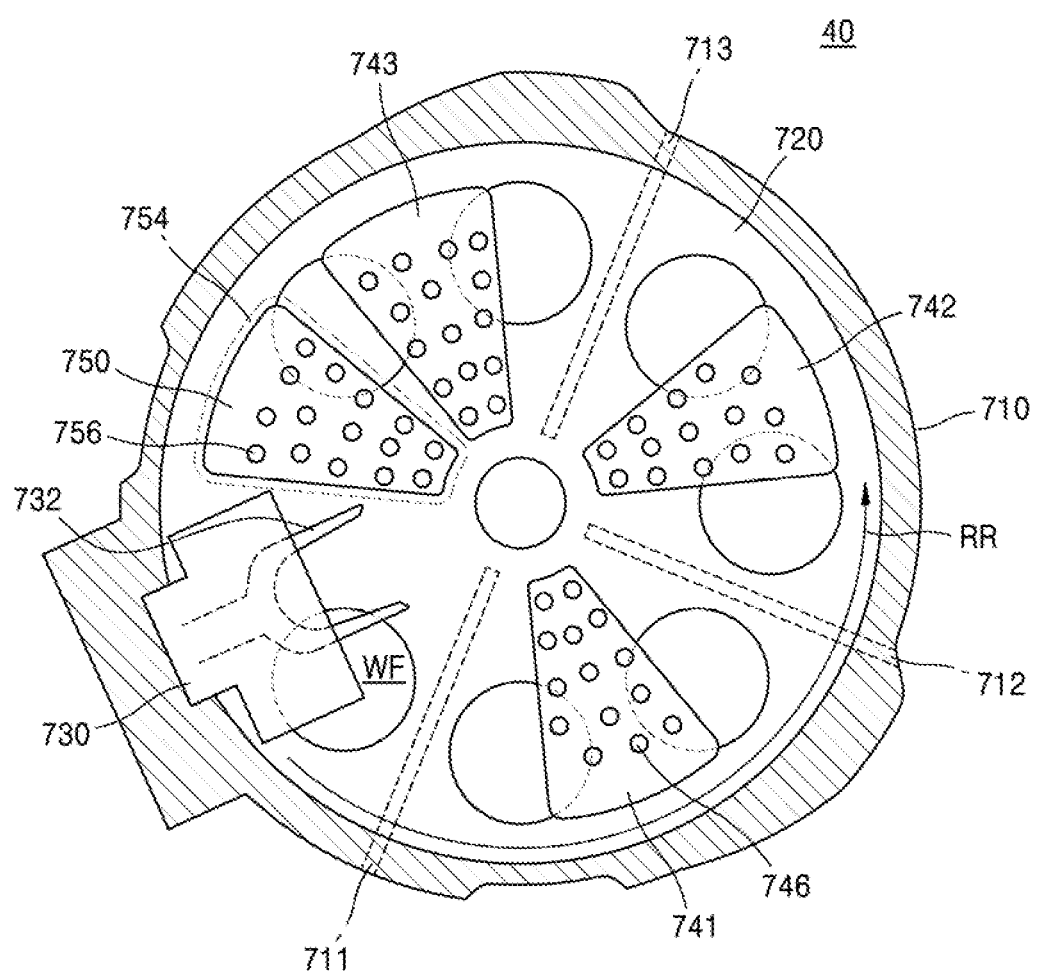
FIGS. 14 and 15 are schematic diagrams illustrating ALD apparatuses according to exemplary embodiments of the present disclosure.
Figure 15:
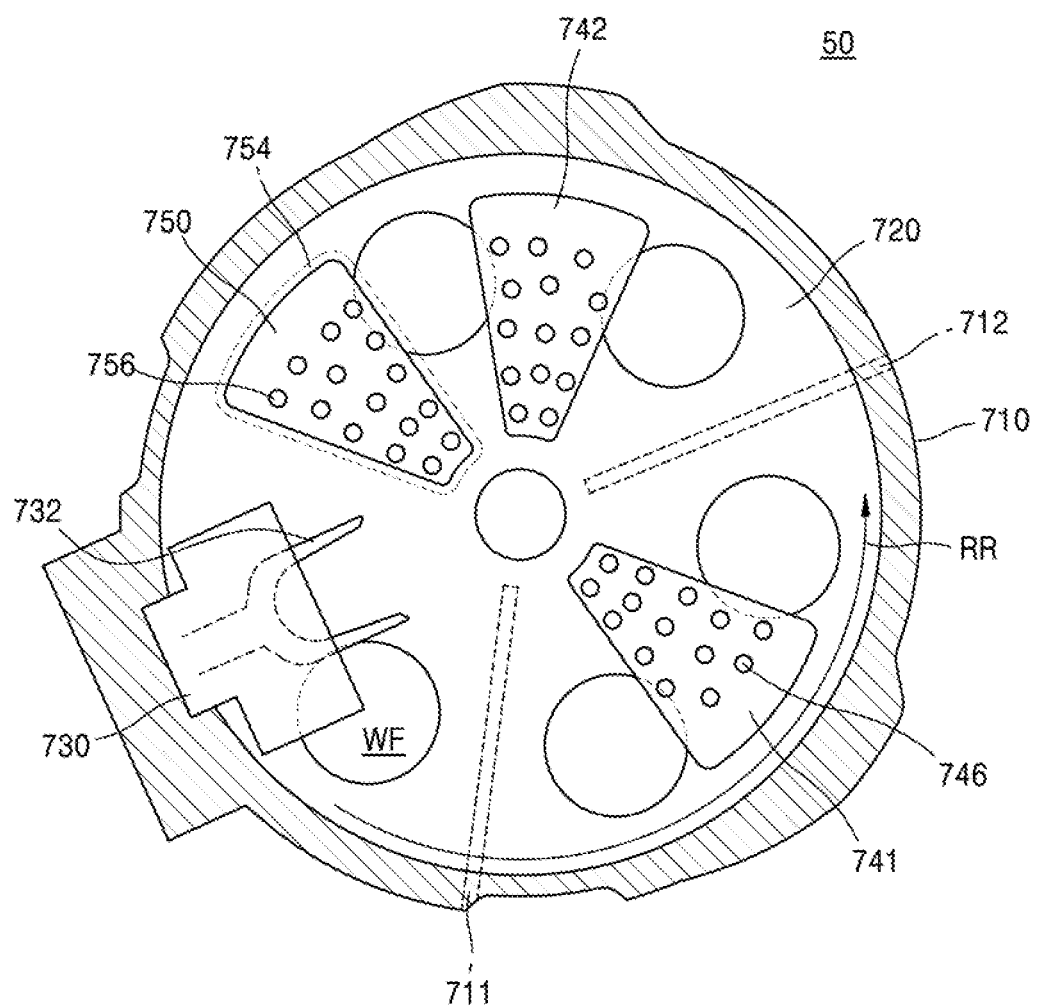

FIGS. 14 and 15 are schematic diagrams of ALD apparatuses 40 and 50 according to exemplary embodiments of the present disclosure.

Referring to FIG. 14, the ALD apparatus 40 may include a housing 710, a deposition region in which first to third supply lines 711 to 713 are located, a rotational unit 720 configured to rotate a mounting region in which a substrate WF is mounted, in a rotational direction RR, a load lock region 730, first to third surface treatment regions 741 to 743, and a heat treatment region 750.

The housing 710 may provide an airtight space isolated from the outside. The housing 710 may include the first supply line 711 configured to supply a first source gas to the deposition region, the second supply line 712 configured to supply a second source gas to the deposition region, and the third supply line 713 configured to supply a third source gas to the deposition region.

The rotation unit 720 may include a plurality of mounting regions. The substrate WF may be mounted in each of the plurality of mounting regions. The number of substrates WF mounted on the rotation unit 720 may be only exemplary and the present invention is not limited thereto. The rotation unit 720 may rotate in a rotational direction RR, which is a counterclockwise direction. In other embodiments, the rotation unit 720 may rotate in a rotational direction RR, which is a clockwise direction.

The load lock region 730 may include a robot arm 732 configured to load the substrate WF into a chamber or unload the substrate WF out of the chamber. The robot arm 732 may operate to mount the substrate WF in the mounting region of the rotation unit 720.

Each of the first to third surface treatment regions 741 to 743 may include a first optical source irradiation unit 746 configured to emit a first optical source. The first optical source irradiation unit 746 may irradiate an upper surface of the substrate WF from above the rotation unit 720.

The heat treatment region 750 may include a heat source supply unit 754 configured to supply a heat source and a second optical source irradiation unit 756 configured to emit a second optical source. The heat source supply unit 754 may supply a heat source toward a lower surface of the substrate WF from below the rotational unit 720. The second optical source irradiation unit 756 may irradiate the upper surface of the substrate WF from above the rotational unit 720.

A power density of the second optical source irradiation unit 756 of the heat treatment region 750 may be higher than a power density of the first optical source irradiation unit 746 of each of the first to third surface treatment regions 741 to 743.

A process sequence of the ALD apparatus 40, according to exemplary embodiments of the present disclosure, will now be described. One substrate WF will be described as an example for brevity, but the same description may be applied to the remaining substrates WF.

The rotational direction RR and the process sequence may be determined such that first to third material films (refer to M1 to M3 in FIGS. 7A to 7E) may be adsorbed on the substrate WF in a predetermined order.

The rotation unit 720 may supply the first source gas from the first supply line 711 located in the deposition region to the substrate WF mounted in the mounting region and induce the adsorption of the first material film (refer to M1 in FIG. 7A). Thereafter, the rotation unit 720 may rotate the substrate WF mounted in the mounting region such that the substrate WF overlaps the first surface treatment region 741. Thus, a surface treatment process may be performed to remove a reaction byproduct remaining on a surface of the first material film (refer to M1 in FIG. 7A).

Subsequently, the rotation unit 720 may rotate the substrate WF mounted in the mounting region, supply the second source from the second supply line 712 located in the deposition region, and induce the adsorption of the second material film (refer to M2 in FIG. 7C) on the first material film (refer to M1 in FIG. 7A). Thereafter, the rotation unit 720 may rotate the substrate WF mounted in the mounting region such that the substrate WF overlaps the second surface treatment region 742. Thus, a surface treatment process may be performed to remove a reaction byproduct remaining on a surface of the second material film (refer to M2 in FIG. 7C).

Next, the rotation unit 720 may rotate the substrate WF mounted in the mounting region, supply the third source gas from the third supply line 713 located in the deposition region, and induce the adsorption of the third material film (refer to M3 in FIG. 7E) on the second material film (refer to M2 in FIG. 7C). Afterwards, the rotation unit 720 may rotate the substrate WF mounted in the mounting region such that the substrate WF overlaps the third surface treatment region 743. A surface treatment process may be performed to remove a reaction byproduct remaining on a surface of the third material film (refer to M3 in FIG. 7E).

When the reaction byproduct has been removed, the rotation unit 720 may rotate the substrate WF mounted in the mounting region such that the substrate WF overlaps the heat treatment region 750. Thus, a heat treatment process may be performed on the substrate WF on which the first to third material films (refer to M1 to M3 in FIGS. 7A to 7E) are adsorbed in a predetermined order, so that the first to third material films (refer to M1 to M3 in FIGS. 7A to 7E) may be formed into a single compound thin film (refer to MX in FIG. 7G).

For example, in the ALD apparatus 40, according to exemplary embodiments of the present inventive concept, an adsorption induction process, a surface treatment process, and a heat treatment process on the first to third material films (refer to M1 to M3 in FIGS. 7A to 7E) may each be performed in one chamber.

Referring to FIG. 15, an ALD apparatus 50 may include a housing 710, a deposition region in which first and second supply lines 711 and 712 are located, a rotation unit 720 configured to rotate a mounting region in which a substrate WF is mounted, in a rotational direction RR, a load lock region 730, first and second surface treatment regions 741 and 742, and a heat treatment region 750.

The ALD apparatus 50 may be substantially the same as the ALD apparatus 40 except that the ALD apparatus 50 includes two deposition regions and two surface treatment regions and thus, a detailed description thereof will be omitted.

Figure 16:
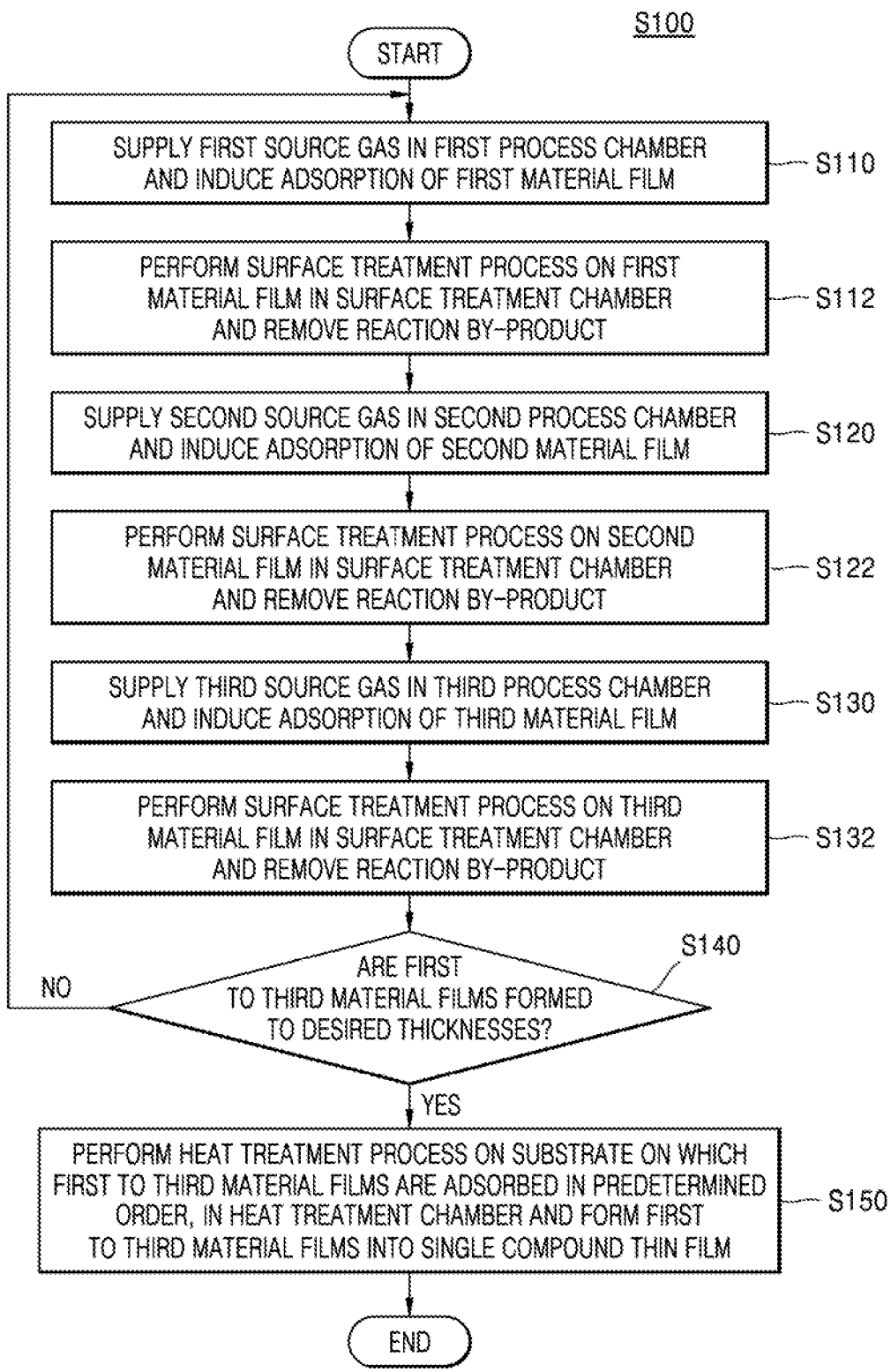
FIG. 16 is a flowchart illustrating a method of forming a thin film using an ALD apparatus, according to an exemplary embodiment of the present disclosure.

FIG. 16 is a flowchart of a method S100 of forming a thin film using an ALD apparatus (refer to 10 in FIGS. 1 to 6) according to an exemplary embodiment of the present disclosure.

It is to be understood that the method steps described herein need not be performed in the recited order and may be performed in any order or at the same time.

A method of forming a single compound thin film on a substrate WF using the ALD apparatus 10 will now be described in sequential order with reference to FIGS. 1 to 6 and 16.

The method S100 of forming the thin film may include supplying a first source gas GAS1 to the substrate WF in a first process chamber PC1 and inducing the adsorption of a first material film (operation S110) and performing a surface treatment on the first material film in a surface treatment chamber STC and removing a reaction byproduct (operation S112).

Thereafter, the method S100 of forming the thin film may include supplying a second source gas GAS2 in a second process chamber PC2 and inducing the adsorption of a second material film (operation S120) and performing a surface treatment process on the second material film in the surface treatment chamber STC and removing a reaction byproduct (operation S122).

Subsequently, the method S100 of forming the thin film may include supplying a third source gas GAS3 in a third process chamber PC3 and inducing the adsorption of a third material film (operation S130) and performing a surface treatment process on the third material film in the surface treatment chamber STC and removing a reaction byproduct (operation S132). Prior to operation S130, operations S110 and S112 may be repeated so that a first material film may be adsorbed on the second material film.

Next, the method S100 of forming the thin film may include confirming whether the first to third material films have been formed to desired thicknesses (operation S140).

Where it is determined that the first to third material films have been formed to the desired thickness (yes, operation S140), a heat treatment process may be performed on the substrate WF on which the first to third material films are adsorbed in a predetermined order, in a heat treatment chamber HTC, and forming the first to third material films into a single compound thin film (operation S150).

Figure 17:
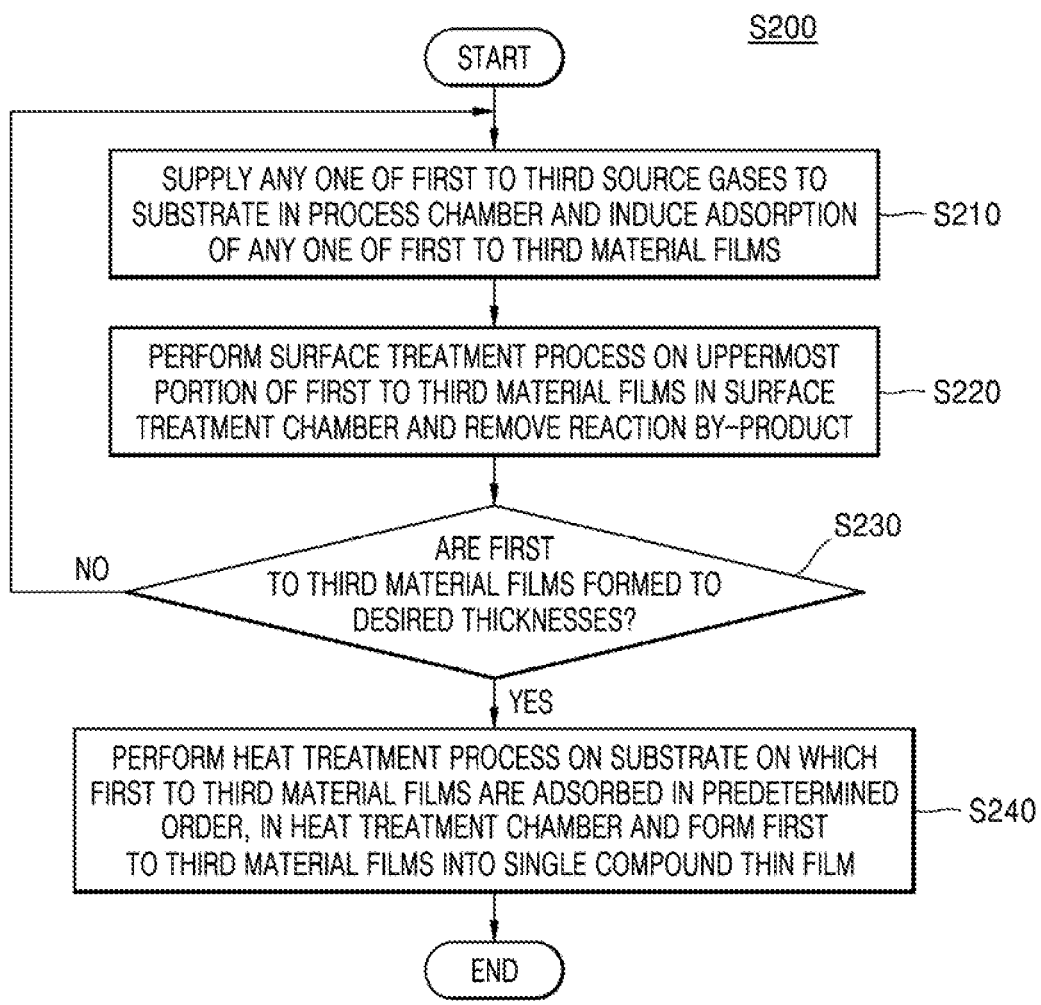
FIG. 17 is a flowchart illustrating a method of forming a thin film using an ALD apparatus, according to an exemplary embodiment of the present disclosure.

FIG. 17 is a flowchart of a method S200 of forming a thin film using an ALD apparatus (refer to 20 in FIGS. 8 to 10) according to an exemplary embodiment of the present disclosure.

A method of forming a single compound thin film on a substrate WF using the ALD apparatus 20 will now be described with reference to FIGS. 8 to 10 and 17.

The method S200 of forming the thin film may include supplying any one of first to third source gases GAS1 to GAS3 to the substrate WF in a process chamber PC and inducing the adsorption of any one of first to third material films (operation S210) and performing a surface treatment process on an uppermost portion of the first to third material films in a surface treatment chamber STC and removing a reaction byproduct (operation S220). A gas controller may control and supply different source gases (e.g., the first to third source gases GAS1 to GAS3) in the process chamber PC so that a first material film may be adsorbed directly on the second material film and a first material film may be adsorbed directly on the third material film.

Thereafter, the method S200 of forming the thin film may include confirming whether the first to third material films have been formed to desired thicknesses (operation S230).

When it is confirmed that the first to third material films have been formed to the desired thickness (yes, operation S230), a heat treatment process may be performed on the substrate WF on which the first to third material films are adsorbed in a predetermined order, in a heat treatment chamber HTC and forming the first to third material films into a single compound thin film (operation S240).

Figure 18:
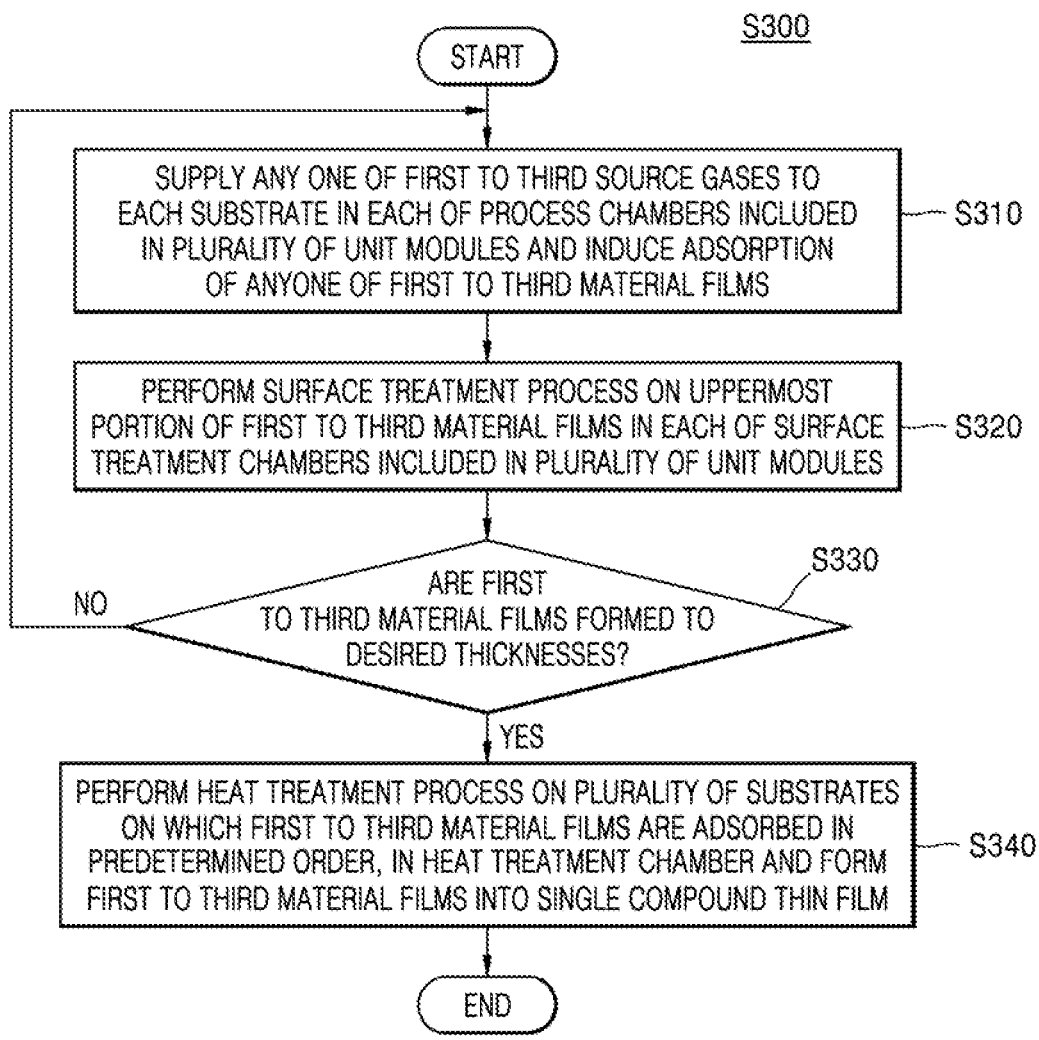
FIG. 18 is a flowchart illustrating a method of forming a thin film using an ALD apparatus, according to an exemplary embodiment of the present disclosure.

FIG. 18 is a flowchart of a method S300 of forming a thin film using an ALD apparatus (refer to 30 in FIGS. 11 to 13) according to an exemplary embodiment of the present disclosure.

A method of forming a single compound thin film on a substrate WF using the ALD apparatus 30 will now be described in a sequential order with reference to FIGS. 11 to 13 and 18.

The method S300 of forming the thin film may include supplying any one of first to third source gases GAS1 to GAS3 to each substrate WF in each of process chambers PC included in a plurality of unit modules UM1 to UM5 and inducing the adsorption of any one of first to third material films (operation S310) and performing a surface treatment process on an uppermost portion of the first to third material films in each of surface treatment chambers STC included in the plurality of unit modules UM1 to UM5 and removing a reaction byproduct (operation S320). A gas controller may control and supply different source gases (e.g., the first to third source gases GAS1 to GAS3) in the process chamber PC so that the first material film may be adsorbed directly on the second material film and the first material film may be adsorbed directly on the third material film.

Subsequently, the method S300 of forming the thin film may include confirming whether the first to third material films have been formed to desired thicknesses (operation S330).

When it has been confirmed that the first to third material films have been formed to the desired thickness (yes, operation S330), a heat treatment process may be performed on a plurality of substrates WF on which the first to third material films are adsorbed in a predetermined order, in a heat treatment chamber HTC-B, and the first to third material films may be formed into a single compound thin film (operation S340).

FIGS. 19A to 19D are cross-sectional views of a method of manufacturing a semiconductor device using a method of forming a thin film according to an exemplary embodiment of the present disclosure.

Figure 19A:
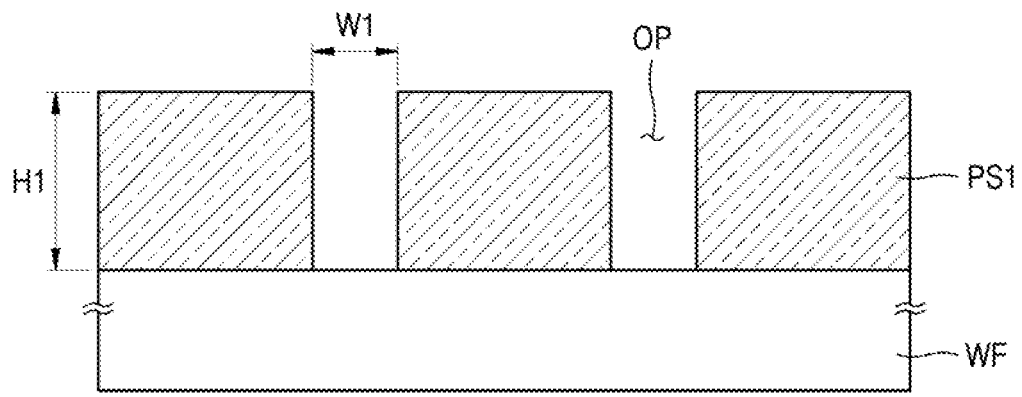
FIGS. 19A to 19D are cross-sectional views illustrating a method of manufacturing a semiconductor device using a method of forming a thin film according to an exemplary embodiment of the present disclosure.
Figure 19B:
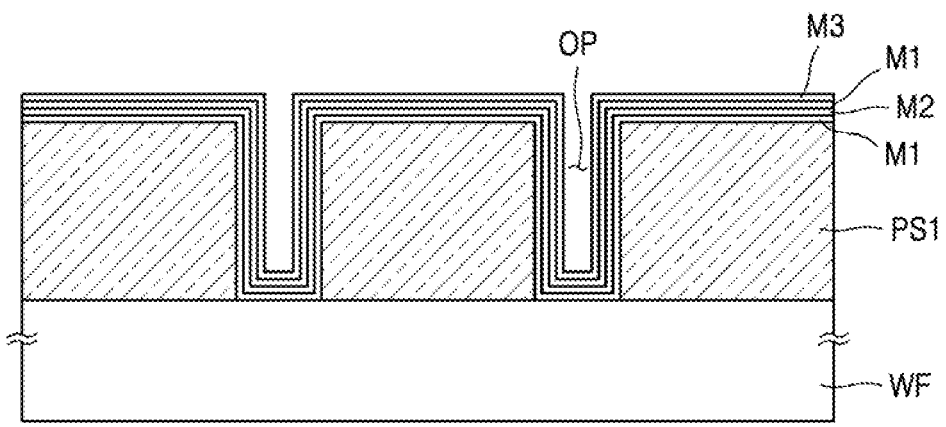

Referring to FIG. 19A, a first preliminary structure layer may be formed on a surface of a substrate WF. Photolithography and etching processes may be performed using a mask so that a portion of the top surface of the substrate WF is exposed. Thus, a first structure layer PS1 including an opening OP may be formed.

The substrate WF may include a semiconductor substrate, such as a silicon (Si) substrate, a germanium (Ge) substrate, a silicon carbide (SiC) substrate, a gallium arsenide (GaAs) substrate, and an indium arsenic (InAs) substrate. In some exemplary embodiments of the present disclosure, the substrate WF may include a silicon-on-insulator (SOI) structure. Also, the substrate WF may include a conductive region, for example, a doped well or a doped structure. Furthermore, the substrate WF may include various isolation structures, such as a shallow trench isolation (STI) structure.

In some exemplary embodiments of the present disclosure, the first structure layer PS1 may include an insulating material. In other embodiments, the first structure layer PS1 may include a conductive material. A material for the first structure layer PS1 may vary according to purposes.

The opening OP may have a high aspect ratio (e.g. the aspect ratio being defined as W1:H1). An area of a unit memory device may be minimized with increases in the capacity and integration density of semiconductor devices. Thus, the opening OP having a high aspect ratio (W1:H1) may be formed.

Figure 19C:
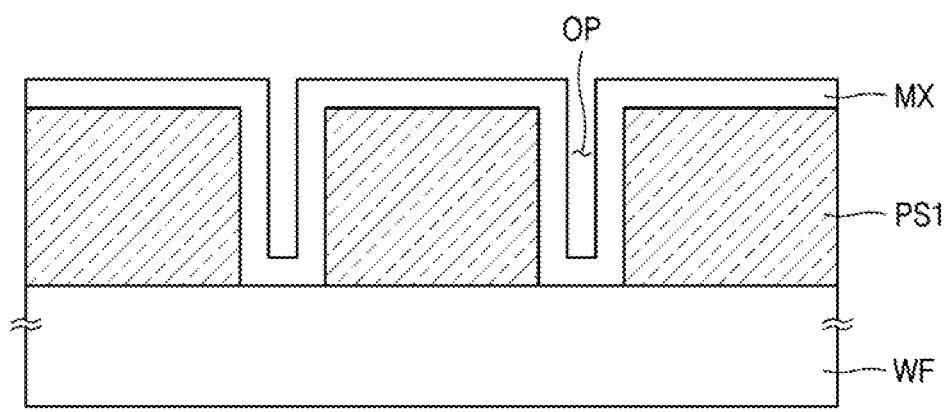
Figure 19D:
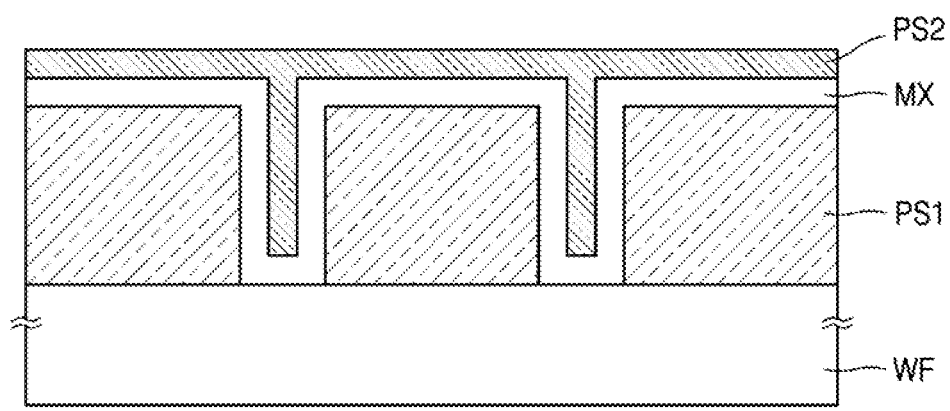

Referring to FIG. 19D, first to third material films M1 to M3 may be conformally formed in a predetermined order on a top surface of the first structure layer PS1, side surfaces of the first structure layer PS1, and an exposed surface of the substrate WF.

The methods S100, S200, and S300 of forming the thin films, according to exemplary embodiments of the present disclosure, may be employed so that the first to third material films M1 to M3 may be conformally formed in a predetermined order to have substantially the same thickness along a space defined by the opening OP having the high aspect ratio (W1:H1).

Although the first to third material films M1 to M3 are formed to a thickness of about 40 Å to about 200 Å, but the present invention is not limited thereto. Thicknesses of the first to third material films M1 to M3 may vary according to purposes.

Referring to FIG. 19C, a heat treatment process may be performed so that the first to third material films (refer to M1 to M3 in FIG. 19B) may be formed into a single compound thin film MX.

The single compound thin film MX may have a crystalline structure with a CS. For example, by simultaneously performing the heat treatment process on the first to third material films (refer to M1 to M3 in FIG. 19B) adsorbed in the predetermined order, the formation of a phase of an undesired composition may be prevented to increase the quality of the thin film.

Referring to FIG. 19D, a second structure layer PS2 may be formed on the single compound thin film MX on which the heat treatment process is performed, thereby completely filling the space defined by the opening (refer to OP in FIG. 19C).

The second structure layer PS2 may include a different material from the first structure layer PS1. A material for the second structure layer PS2 may vary according to purposes.

As described above, the quality of a thin film used for a semiconductor device can be increased by using the methods S100, S200, and S300 of forming the thin films according to exemplary embodiments of the present disclosure. Thus, the reliability and productivity of the semiconductor device can be enhanced.

Exemplary embodiments of the present inventive concept are disclosed in the above description and the drawings. It will be understood by those of ordinary skill in the art that various changes in form and details may be made to the disclosed embodiments without departing from the spirit and scope of the present inventive concept.

What is claimed is:

1. An atomic layer deposition apparatus, comprising:
a first process chamber configured to supply a first source gas to a substrate and to thereby induce adsorption of a first material film on the substrate;
a second process chamber configured to supply a second source gas to the substrate and to thereby induce adsorption of a second material film on the substrate, wherein the second source gas is different from the first source gas;
a third process chamber configured to supply a third source gas to the substrate and to thereby induce absorption of a third material film on the substrate, wherein the third source gas is different from each of the first and second source gases;
a surface treatment chamber, including a first optical source irradiation unit of a first power density, configured to perform a surface treatment process on each of the first to third material films and to remove a reaction byproduct; and
a heat treatment chamber, including a second optical source irradiation unit of a second power density higher than the first power density of the first optical source unit of the surface treatment dumber, configured to perform a heat treatment process on the substrate and to thereby transform the first to third material films into a single compound thin film.

2. The atomic layer deposition apparatus of claim 1, wherein the surface treatment chamber is of a single wafer type, and
wherein the first optical source irradiation unit is configured to irradiate an upper surface of the substrate from above.

3. The atomic layer deposition apparatus of claim 2, wherein an upper portion of the surface treatment chamber comprises a transparent material, and
wherein the surface treatment process for removing the reaction byproduct is performed using the first optical source irradiation unit.

4. The atomic layer deposition apparatus of claim 3, wherein the first optical source irradiation unit produces infrared (IR) light, ultraviolet (UV) light, or laser light of any frequency/color.

5. The atomic layer deposition apparatus of claim 1, wherein the heat treatment chamber is of a single wafer type, wherein the heat treatment chamber comprises:

the second optical source irradiation unit, wherein the second optical source irradiation unit is configured to irradiate an upper surface of the substrate from above; and
a substrate support unit configured to support the substrate from below and to heat a lower surface of the substrate, wherein a temperature of the substrate in the heat treatment chamber is higher than a temperature of the substrate in each of the first to third process chambers.

6. The atomic layer deposition apparatus of claim 5, wherein an upper portion of the heat treatment chamber comprises a transparent material, and
wherein the heat treatment process for forming the single compound thin film is performed using the second optical source irradiation unit and the heat of the substrate support unit.

7. The atomic layer deposition apparatus of claim 1, wherein each of the first to third process chambers performs a purge process for removing portions of the first to third source gases and the reaction byproduct which are not adsorbed after the adsorption of the first to third material films is induced.

8. The atomic layer deposition apparatus of claim 1, wherein the the substrate is transferred among the first to third process chambers, the surface treatment chamber, and the heat treatment chamber using a track or a rail, and
wherein the transferring of the substrate is performed in a vacuum state.

9. The atomic layer deposition apparatus of claim 8, wherein the transferring of the substrate is performed such that the first material film is located directly under each of the second and third material films.

10. The atomic layer deposition apparatus of claim 8, wherein the surface treatment chamber is located adjacent to each of the first to third process chambers and is spaced a same distance apart from each of the first to third process chambers.

11. An atomic layer deposition apparatus, comprising: a plurality of unit modules, each of which comprises a process chamber and a surface treatment chamber including a first optical source irradiation unit of a first power density; and a heat treatment chamber including a second optical source irradiation unit of a second power density higher than the first power density of the first optical source unit of the surface treatment chamber, configured to receive a plurality of substrates from the plurality of unit modules, wherein the process chamber of each of the plurality of unit modules is configured to supply first to third source gases to each of the plurality of substrates in a predetermined order and to thereby induce adsorption of first to third material films on each of the plurality of substrates in the predetermined order, wherein the surface treatment chamber of each of the plurality of unit modules is configured to perform a surface treatment process on each of the first to third material films and to remove a reaction byproduct, and wherein the heat treatment chamber is configured to perform a heat treatment process on the plurality of substrates on which the first to third material films are adsorbed in the predetermined order and thereby transforms the first to third material films into a single compound thin film.

12. The atomic layer deposition apparatus of claim 11, wherein the surface treatment chamber of each of the plurality of unit modules is of a single wafer type,
wherein the first optical source irradiation unit is configured to irradiate a top surface of the substrate from above.

13. The atomic layer deposition apparatus of claim 12, wherein each of the plurality of unit modules is configured to perform a purge process after adsorption of any one of the first to third material films is induced in the process chamber, wherein the atomic layer deposition apparatus further includes a transfer chamber configured to transfer the substrate to the surface treatment chamber, and the surface treatment chamber is configured to perform the surface treatment process for removing the reaction byproduct using the first optical source irradiation unit.

14. The atomic layer deposition apparatus of claim 11, wherein the heat treatment chamber is of a batch type and comprises a heater unit configured to supply a heat source to the plurality of substrates.

15. The atomic layer deposition apparatus of claim 11, wherein the plurality of unit modules are arranged in a circular form around the heat treatment chamber.

16. The atomic layer deposition apparatus of claim 1, further including a transfer chamber configured to transfer the substrate among the first to third process chambers, the surface treatment chamber, and the heat treatment chamber, wherein the transfer chamber is connected to each of the first to third process chambers, the surface treatment chamber, and the heat treatment chamber, wherein the transfer chamber includes a housing, a rotation support unit, a chain, and a driver, and wherein an interior of the housing is maintained in a vacuum state and the rotation support unit, the chain, and the driver are disposed on an exterior of the housing.

17. The atomic layer deposition apparatus of claim 16, wherein the chain is connected to a sprocket coupled to the rotation support unit so that the rotation support unit and each of a plurality of additional rotation support units are rotatably interlocked with each other and a tension roller is configured to apply pressure to the chain and thereby provide tension.

18. The atomic layer deposition apparatus of claim 16, wherein the driver is configured to receive rotary power of a driving motor, transmit the rotary power to the rotation support unit through a connection member, and distribute the rotary power of the driving motor to opposite sides using a gear.

* * * * *